(12) United States Patent
Colombeau et al.

(10) Patent No.: US 12,027,607 B2
(45) Date of Patent: Jul. 2, 2024

(54) METHODS FOR GAA I/O FORMATION BY SELECTIVE EPI REGROWTH

(71) Applicant: Applied Materials, Inc., Santa Clara, CA (US)

(72) Inventors: Benjamin Colombeau, San Jose, CA (US); Matthias Bauer, Sunnyvale, CA (US); Naved Ahmed Siddiqui, Sunnyvale, CA (US); Phillip Stout, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/843,968

(22) Filed: Jun. 18, 2022

(65) Prior Publication Data
US 2022/0320318 A1   Oct. 6, 2022

Related U.S. Application Data

(62) Division of application No. 17/077,153, filed on Oct. 22, 2020, now Pat. No. 11,393,916.
(Continued)

(51) Int. Cl.
*H01L 29/66* (2006.01)
*H01L 21/02* (2006.01)
(Continued)

(52) U.S. Cl.
CPC .. *H01L 29/66742* (2013.01); *H01L 21/02532* (2013.01); *H01L 21/02538* (2013.01);
(Continued)

(58) Field of Classification Search
CPC ......... H01L 29/66742; H01L 21/02532; H01L 21/02538; H01L 21/02603; H01L 21/02636; H01L 21/823807; H01L 21/823828; H01L 27/092; H01L 29/0673; H01L 29/42392; H01L 29/66522; H01L 29/66545; H01L 29/78696; H01L 29/0847;
(Continued)

(56) References Cited

U.S. PATENT DOCUMENTS

| 10,510,620 B1* | 12/2019 | Chanemougame ......................... H01L 27/0924 |
| 2015/0263097 A1* | 9/2015 | Cheng ............. H01L 21/823821 438/157 |

(Continued)

FOREIGN PATENT DOCUMENTS

TW    201931565 A    8/2019

OTHER PUBLICATIONS

PCT International Search Report and Written Opinion in PCT/US2020/056768 dated Feb. 10, 2021, 10 pages.
(Continued)

*Primary Examiner* — Tong-Ho Kim
(74) *Attorney, Agent, or Firm* — Servilla Whitney LLC

(57) ABSTRACT

Electronic devices and methods of forming electronic devices with gate-all-around non-I/O devices and finlike structures for I/O devices are described. A plurality of dummy gates is etched to expose a fin comprising alternating layers of a first material and a second material. The second material layers are removed to create openings and the first material layers remaining are epitaxially grown to form a finlike structure.

6 Claims, 28 Drawing Sheets

Related U.S. Application Data

(60) Provisional application No. 62/924,661, filed on Oct. 22, 2019.

(51) Int. Cl.
*H01L 21/8238* (2006.01)
*H01L 27/092* (2006.01)
*H01L 29/06* (2006.01)
*H01L 29/423* (2006.01)
*H01L 29/786* (2006.01)

(52) U.S. Cl.
CPC .. *H01L 21/02603* (2013.01); *H01L 21/02636* (2013.01); *H01L 21/823807* (2013.01); *H01L 21/823828* (2013.01); *H01L 27/092* (2013.01); *H01L 29/0673* (2013.01); *H01L 29/42392* (2013.01); *H01L 29/66522* (2013.01); *H01L 29/66545* (2013.01); *H01L 29/78696* (2013.01)

(58) Field of Classification Search
CPC ........... H01L 29/0653; H01L 29/66439; H01L 29/66469; H01L 29/775; H01L 21/823821; H01L 27/0924; H01L 29/66795; H01L 29/785; B82Y 10/00
USPC .......................................................... 257/351
See application file for complete search history.

(56) References Cited

U.S. PATENT DOCUMENTS

| | | |
|---|---|---|
| 2017/0018462 A1 | 1/2017 | Suk et al. |
| 2017/0229553 A1 | 8/2017 | Basker et al. |
| 2017/0278865 A1 | 9/2017 | Ching et al. |
| 2018/0240871 A1 | 8/2018 | Cheng et al. |
| 2019/0097055 A1 | 3/2019 | Dewey et al. |
| 2019/0115438 A1 | 4/2019 | Ching et al. |
| 2019/0123160 A1 | 4/2019 | Xie et al. |
| 2020/0343387 A1* | 10/2020 | Liaw ...................... H01L 27/088 |
| 2021/0083074 A1 | 3/2021 | Yang et al. |
| 2021/0083084 A1* | 3/2021 | Chang ................ H01L 29/66462 |
| 2021/0098457 A1* | 4/2021 | Cheng ................... H01L 29/785 |

OTHER PUBLICATIONS

Bauer, M., et al., "Selective epitaxial growth (SEG) of highly doped Si:P on Source/Drain areas of NMOS devices using Si3H8/PH3/C12 chemistry", ECS Transactions, 33 (6) 629-636 (2010).

Destefanis, V., et al., "Low-thermal surface preparation, HCl etch and Si/SiGe selective epitaxy on (110) silicon surfaces", Semicond. Sci. Technol. 23 (2008) 105018, 9 pages.

Hartmann, J.M., et al., "Effect of HCl on the SiGe growth kinetics in reduced pressure—chemical vapor deposition", Journal of Crystal Growth 241 (2002) pp. 93-100.

Hartmann, J.M., et al., "Growth kinetics of Si and SiGe on Si(1 0 0), Si(1 1 0) and Si(1 1 1) surfaces", Journal of Crystal Growth 294 (2006) pp. 288-295.

Hartmann, J.M., et al., "Growth kinetics of Si on fullsheet, patterned and silicon-on-insulator substrates", Journal of Crystal Growth, Elsevier, 2003, 257, pp. 19-30.

Hartmann, J.M., et al., "Selective epitaxial growth of Si and SiGe for metal oxide semiconductor transistors", Journal of Crystal Growth 259 (2003) pp. 419-427.

Hikavyy, Andriy, et al., "Investigation of Cl2 etch in view of extremely low temperature selective epitaxial processes", Semicond. Sci. Technol. 32 (2017) 114006, 5 pages.

\* cited by examiner

METHODS FOR GAA I/O FORMATION BY SELECTIVE EPI REGROWTH

CROSS-REFERENCE TO RELATED APPLICATIONS

This application is a divisional of U.S. patent application Ser. No. 17/077,153, filed Oct. 22, 2020, which claims priority to U.S. Provisional Application No. 62/924,661, filed Oct. 22, 2019, the entire disclosures of which are hereby incorporated by reference herein.

TECHNICAL FIELD

Embodiments of the present disclosure generally relate to semiconductor devices and more particularly to horizontal gate all around device structures and methods and apparatus for forming horizontal gate all around device structures.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. It is believed that the hGAA structure provides good electrostatic control and can find broad adoption in complementary metal oxide semiconductor (CMOS) wafer manufacturing.

Logic gate performance is related to the characteristics of the materials used as well as the thickness and area of the structural layers. However, as some gate characteristics are adjusted to accommodate device scaling, challenges arise. Furthermore, the space confinement between pillars on a horizontal gate-all-around (hGAA) device limits the thickness of the gate dielectric material for I/O transistors.

In the natural course of the process flow for hGAA structures, the I/O devices need a higher drive current, and having a sequence of Si/SiGe as in the regular process flow would be detrimental to I/O performance, especially in the case of NMOS devices, as it has been seen. The GAA structures are also inappropriate for I/O devices. Therefore, there is a need for improved methods for forming horizontal gate-all-around devices which allow for formation of fin-like structures.

SUMMARY

One or more embodiments of the disclosure are directed to methods of forming a semiconductor device. A plurality of dummy gates are etched from a substrate surface over a plurality of fins. The plurality of fins extend along a first direction and the dummy gates extend along a second direction crossing the first direction. Etching the plurality of dummy gates exposes portions of the plurality of fins so that portions of the fins on the substrate surface are covered by the dummy gates and portions of the fins are exposed. The fins comprise alternating layers of a first material and a second material. A gate oxide is removed through the trenches formed by etching the dummy gates. The layers of the second material are etched from the plurality of fins through the trenches so that there are alternating first material layers and openings. The first material is epitaxially grown through the trenches to merge the layers of the first material into a contact of first material.

Additional embodiments of the disclosure are directed to semiconductor devices comprising a non-I/O gate region, an I/O gate region, a source-drain non-I/O region, a pFET region and a nFET region.

Further embodiments of the disclosure are directed to semiconductor devices comprising a non-I/O gate region having a gate-all-around structure and a non-I/O gate contact. The gate-all-around structure comprises a plurality of spaced nanosheets. The device comprises an I/O gate region comprises a finFET and an I/O contact, a source-drain non-I/O region comprising a source contact and a drain contact, and a pFET region comprising an epitaxially grown first material and a pFET contact. The epitaxially grown first material has a length, width and height. The width has a plurality of spaced protrusions aligned with the spaced nanosheets. The device further comprises an nFET region comprising an epitaxially grown second material and an nFET contact.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
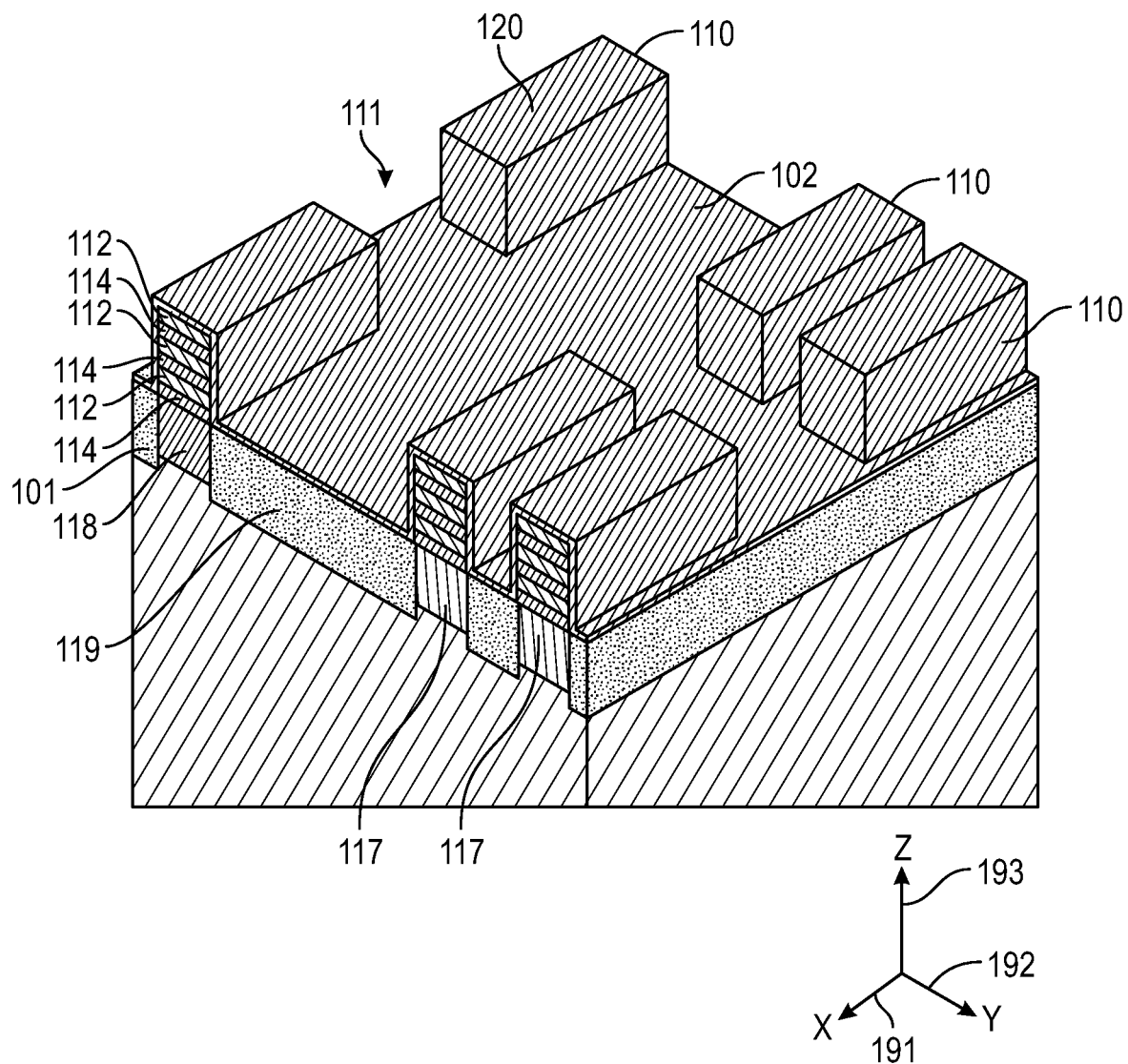
FIGS. 1 through 11F illustrate stages of fabrication of an electronic device according to one or more embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used herein, the term "gate all-around (GAA)," is used to refer to an electronic device, e.g. a transistor, in which the gate material surrounds the channel region on all sides. The channel region of a GAA transistor may include nano-wires or nano-slabs, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

One or more embodiments of the disclosure are directed to methods for forming traditional fin-like structures for I/O devices in logic. Some embodiments advantageously maintain non-I/O devices as nanosheets/nanoslabs for post fin-FET technologies. Some embodiments of the disclosure advantageously provide additional processes to a tradition hGAA process flow after the gate oxide layer has been etched, and the SiGe slabs are removed for GAA workfunction metal deposition. In some embodiments, SiGe removal is followed by ODL (or SOH) deposition, following which the non-I/O regions are masked off. In the exposed I/O regions, the ODL is stripped of and silicon is regrown using epitaxy between and on the nanoslabs until they are pinched off. Once the silicon is sufficiently grown, an etchback process (e.g., using HCl) is performed to recess the sidewalls of the nanoslabs and make the sidewalls vertical, resulting in a fin-like structure made of crystalline silicon for the I/O devices. In some embodiments, the hardmask and the ODL are removed from the non-I/O devices, a work-function metal is deposited as GAA on the non-I/O side and on the outer surface of the regrown fin on the I/O devices.

One or more embodiments of the disclosure are described with reference to the Figures. FIG. 1 shows an electronic device 100 according to one or more embodiment of the disclosure. The electronic device 100 includes a plurality of fins 110 on the substrate surface 102. Each of the Figures illustrates an embodiment with three fins 110 split by trench 111; however, the skilled artisan will recognize that there can be more or less than three fins 110. The fins 110 have a length extending along a first direction 191 (also referred to as the X-direction), a width extending along a second direction 192 (also referred to as the Y-direction), and a height extending along a third direction 193 (also referred to as the Z-direction). The use of the term "horizontal" refers to the plane formed by the first direction 191 and the second direction 192 (also referred to as the X-Y plane). The use of the term "vertical" means the along the third direction 193. The terms "horizontal" and "vertical" are used to illustrate relative directionality and should not be interpreted as any particular relationship relative to the gravitational pull. In some embodiments, the number of fins 110 is a multiple of three.

The fins 110 comprise alternating layers of a first material 112 and a second material 114. The first material 112 and second material 114 of some embodiments are different materials. In some embodiments, the first material 112 comprises at least one III-V material and the second material 114 comprises at least one III-V material so that the first material 112 and second material 114 comprise different materials. In some embodiments, the first material 112 comprises silicon (Si). In some embodiments, the second material 114 comprises silicon germanium (SiGe). The first material 112 and second material 114 can be any suitable thickness and can be deposited by any suitable technique known to the skilled artisan. The layers of the first material 112 and the second material 114 are also referred to as nanosheets.

The fins 110 are formed on a substrate 101 comprising multiple materials. The skilled artisan will recognize that the materials stated herein are merely representative of possible materials and should not be limited to those materials. In the illustrated embodiment, two fins 110 are formed on p-type doped silicon 117 and one fin 110 is formed on n-type doped silicon 118. Between the p-type doped silicon 117 and the n-type doped silicon 118 is a shallow trench isolation (STI) oxide 119.

A gate oxide 120 is formed on the surface 102 of the substrate 101 covering the plurality of fins 110. The gate oxide 120 can be any suitable material deposited by any suitable technique known to the skilled artisan. In some embodiments, the gate oxide 120 is deposited as a conformal layer by an atomic layer deposition (ALD) process. In some embodiments, the gate oxide 120 is a thermally grown oxide. In one or more embodiments, the gate oxide comprises silicon oxide.

Figure 2:
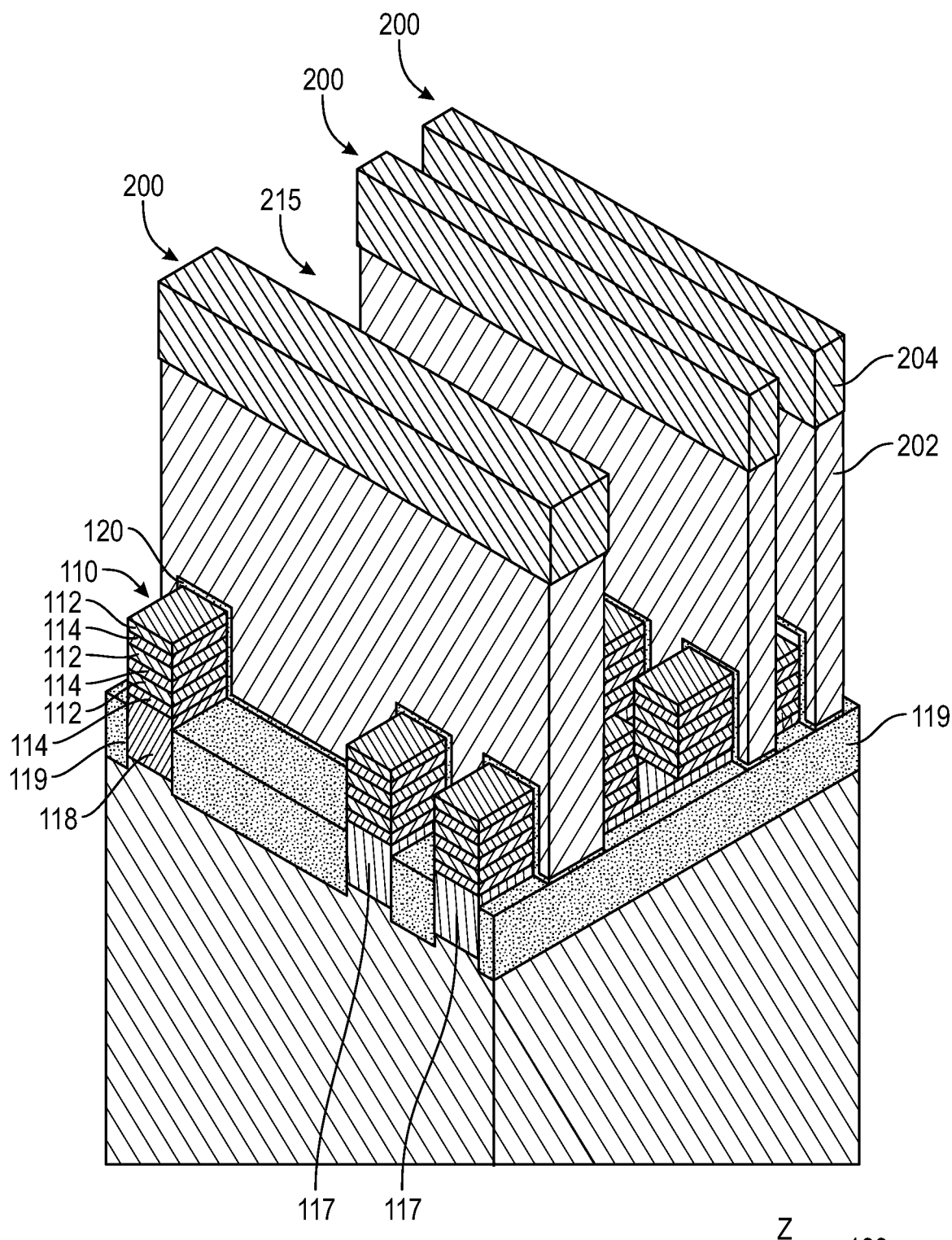

FIG. 2 illustrates the embodiment of FIG. 1 after patterning of a plurality of dummy gates 200 and removal of exposed gate oxide 120. The dummy gates 200 extend along a second direction 192, crossing the first direction 191 at an angle. The angle of some embodiments, is in the range of 30° to 150°, or in the range of 45° to 135°, or in the range of 60° to 120°, or in the range of 75° to 105°, or in the range of 80° to 100°. In some embodiments, the angle is formed by the intersection of the first direction 191 and the second direction 192 is 90°. The plurality of dummy gates 200 are formed over the plurality of fins 110 so that portions 210 of the fins 110 are covered by the dummy gates 200 and portions 220 of the fins 110 are exposed in the gaps 215 between dummy gates 200. The dummy gates 200 of some embodiments are deposited by any suitable technique, masked for patterning and etched. In some embodiments, etching the dummy gates 200 forms trenches 215, exposing portions 220 of the fins 110 with the gate oxide 120. In the illustrated embodiment, the dummy gates 200 are shown with a dummy gate material 202 with a hardmask 204 on top. The dummy gate material 202 can be any suitable material known to the skilled artisan. In some embodiments, the dummy gate material 202 comprises amorphous silicon. The hardmask 204 can be any suitable material deposited by any suitable technique and patterned by any suitable technique (e.g., lithography). In some embodiments, the hardmask comprises silicon nitride.

In some embodiments, as shown in FIG. 2, the gate oxide 120 is etched from the top of the fins 110 exposed in the trenches 215. The gate oxide 120 can be etched by any suitable technique known to the skilled artisan. In some embodiments, the gate oxide 120 is etched using an anisotropic etch process. In some embodiments, the gate oxide 120 is etched using a reactive ion etch (RIE) process.

Figure 3:
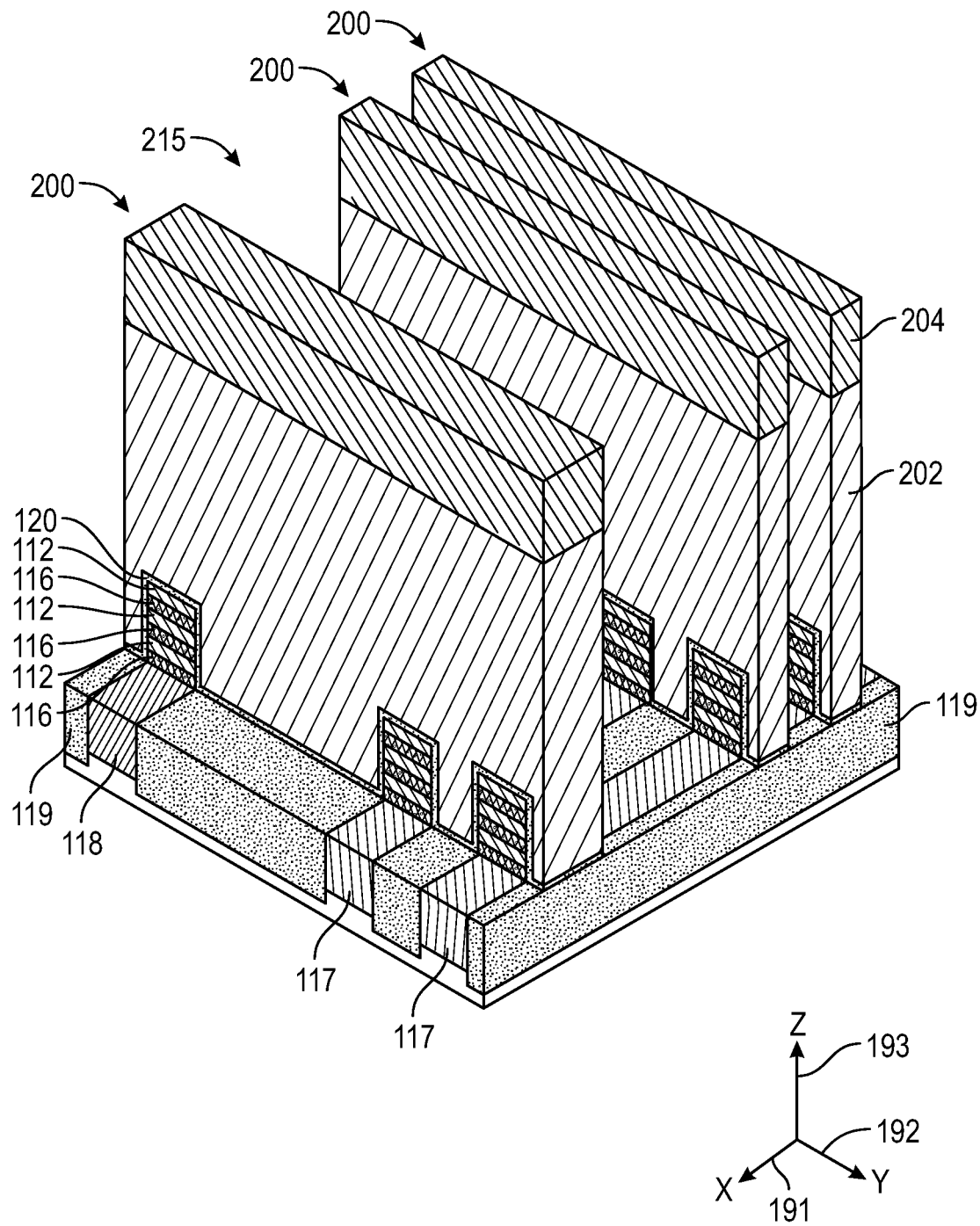

FIG. 3 shows an embodiment similar to FIG. 2 after etching of the first material 112 and second material 114 that are not beneath the dummy gate 200 and formation of an inner spacer 116. The exposed first material 112 and second material 114 (portions of the slabs or nanosheets that are not beneath the dummy gate) are etched by any suitable technique known to the skilled artisan. In some embodiments, the first material 112 and second material 114 are etched by an anisotropic etch process. In some embodiments, the first material 112 and the second material 114 are etched at the same time as the gate oxide 120. In some embodiments, the first material 112 and the second material 114 are etched separately from the gate oxide 120.

The second material 114 is recessed through the trenches 215 by a recess distance under the dummy gate 200. The recess distance can be any suitable distance. In some embodiments, the recess distance is in the range of 1 to 10 nm, or in the range of 2 to 8 nm, or in the range of 3 to 7 nm, or in the range of 4 to 5 nm. The second material 114 can be recessed by any suitable technique known the skilled artisan.

Figure 4:
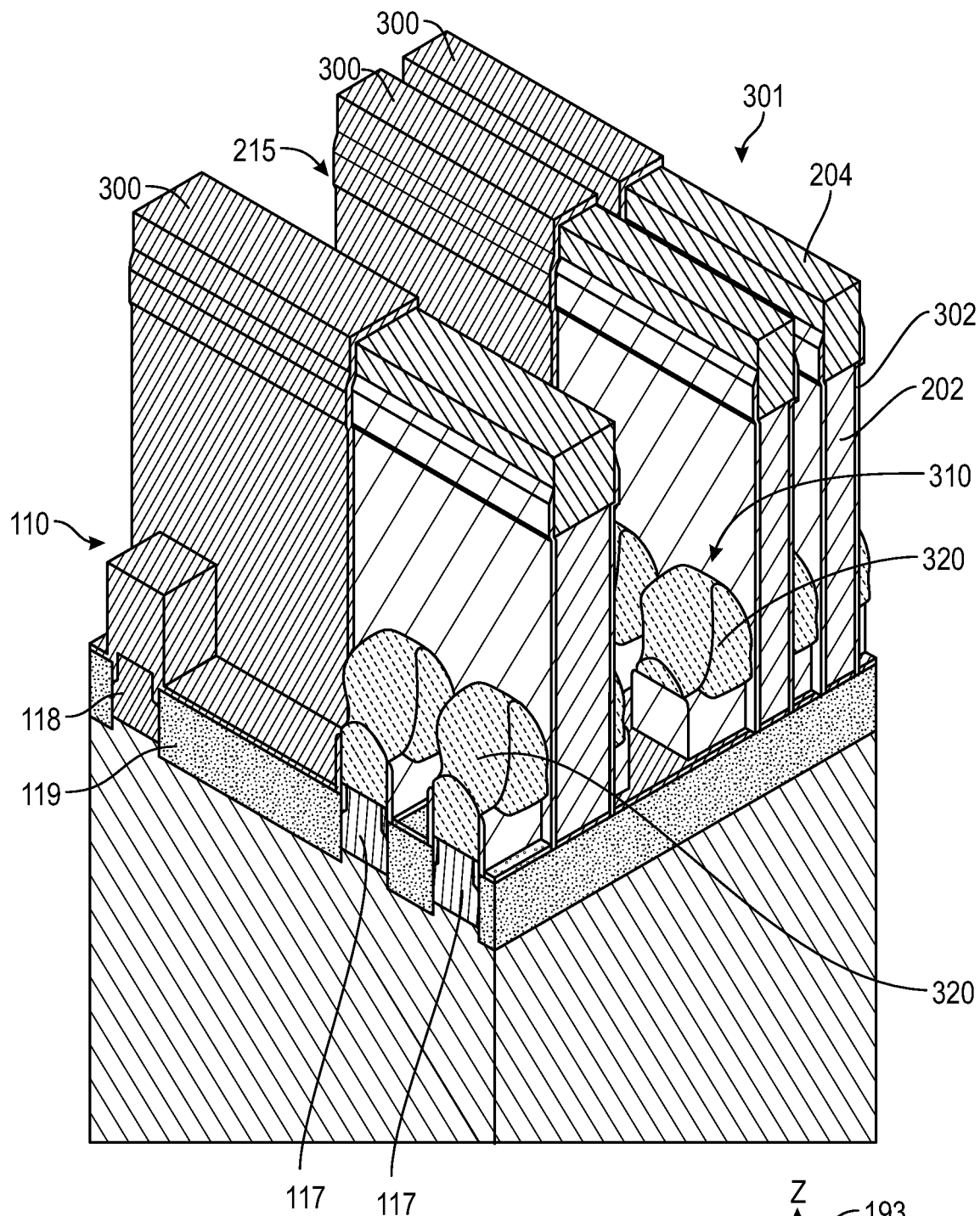

In some embodiments, the inner spacer 116 is deposited by atomic layer deposition as a conformal film that covers the recessed second material 114, the first material 112 and the exposed portions of the dummy gate 200 and STI oxide 119. After a conformation deposition, an anisotropic etch process (e.g., RIE) is used to clean the inner spacer 116 from the top, bottom and sidewalls of the dummy gate 200, leaving the inner spacer 116 within the recessed area left by recessing the second material 114. In some embodiments, the inner spacer 116 is removed from the top and bottom surfaces and left on the sidewalls of the dummy gate as a sidewall spacer 302 (as shown in FIG. 4). The sidewall spacer 302 can be formed separately from either the same material as the inner spacer 116 or a different material 302.

FIG. 4 shows an embodiment similar to FIG. 3 after depositing, masking and patterning a sidewall spacer 302 and a hardmask 300. After patterning, the second material 114 exposed through the hardmask 300 is epitaxially grown to form the pFET in the Source-Drain Non-I/O region. The hardmask 300 is formed on the substrate and patterned to create openings 301 over the source-drain non-I/O region of the electronic device. The fin 110 accessible through the opening of some embodiments is etched between the dummy gates 200 to remove the first material 112 from the fin 110. After etching, the second material 114 is epitaxially grown to form the pFET 320 of the source-drain non-I/O region 310.

The illustrated embodiment shows a process in which the pFET is formed prior to the nFET. However, the skilled artisan will recognize that the nFET can be formed prior to the pFET and will understand the rearrangement of the Figures to accommodate such an embodiment.

In some embodiments, the sidewall spacer 302 is deposited separately from the inner spacer 116 as a conformal film and etched from the horizontal surfaces, leaving the sidewalls of the dummy gate 200 covered with the sidewall spacer 302. In some embodiments, the sidewall spacer 302 prevents direct contact between the hardmask 300 and the dummy gate material 202. The sidewall spacer 302 can be deposited and/or etched by any suitable technique(s) known to the skilled artisan. The sidewall spacer 302 can be any suitable material known to the skilled artisan. In some embodiments, the sidewall spacer 302 comprises a low-k dielectric. The hardmask 300 can be any suitable hardmask deposited by any suitable technique known to the skilled artisan.

Figure 5:
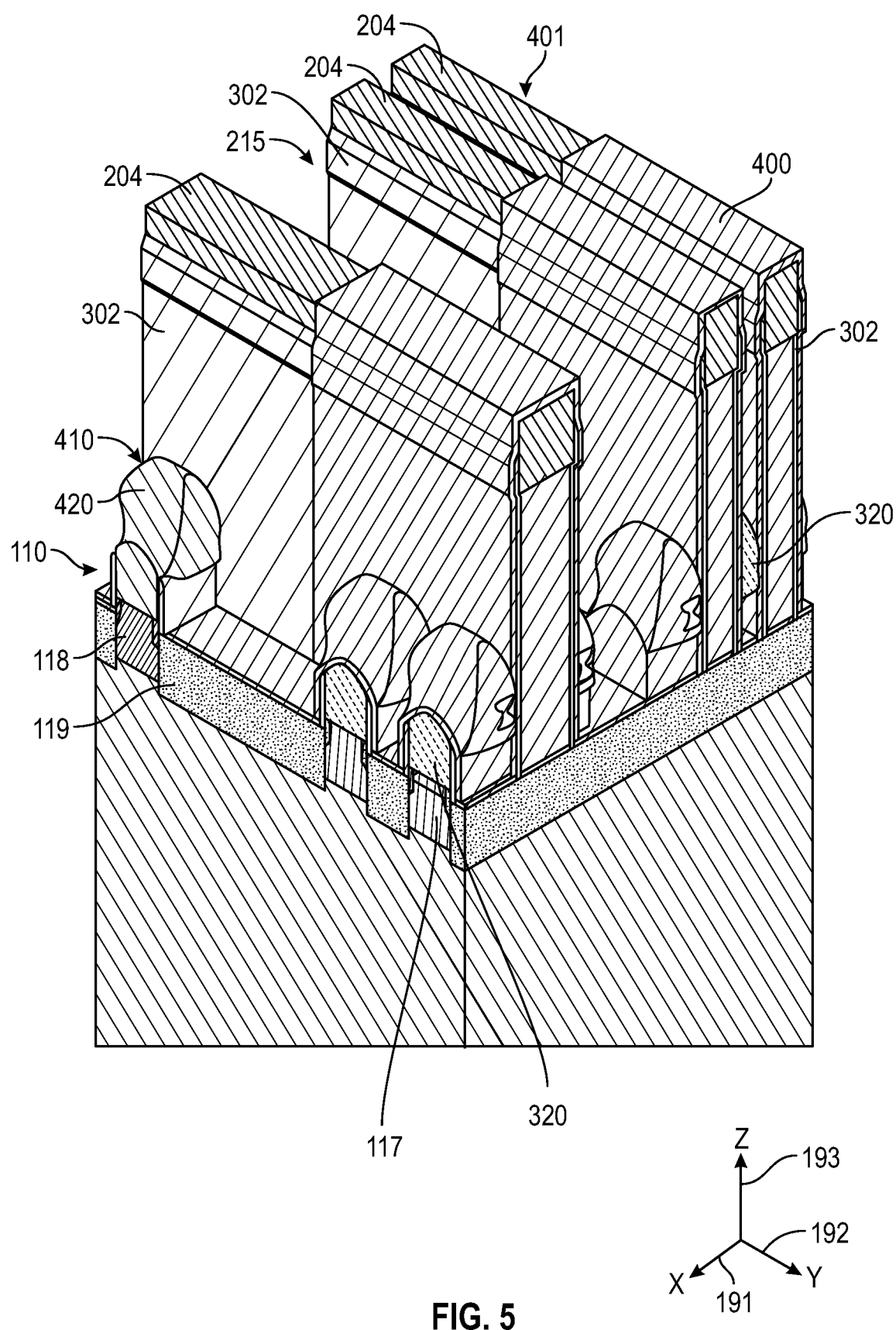

FIG. 5 shows the embodiment of FIG. 4 after removing the hardmask 300, forming a new hardmask 400, masking and patterning the hardmask 400; followed by epitaxial growth of the nFET 420 in the nFET region 410. The hardmask 300 can be removed by any suitable technique known to the skilled artisan. In some embodiments, the hardmask 300 is removed by an etching process. A second hardmask 400 is formed and patterned by any suitable technique known to the skilled artisan to create openings 401 over the nFET region 410. In some embodiments, the nFET is formed prior to formation of the pFET. The skilled artisan will recognize and understand how to form the nFET and then the pFET without undue experimentation.

Figure 6:
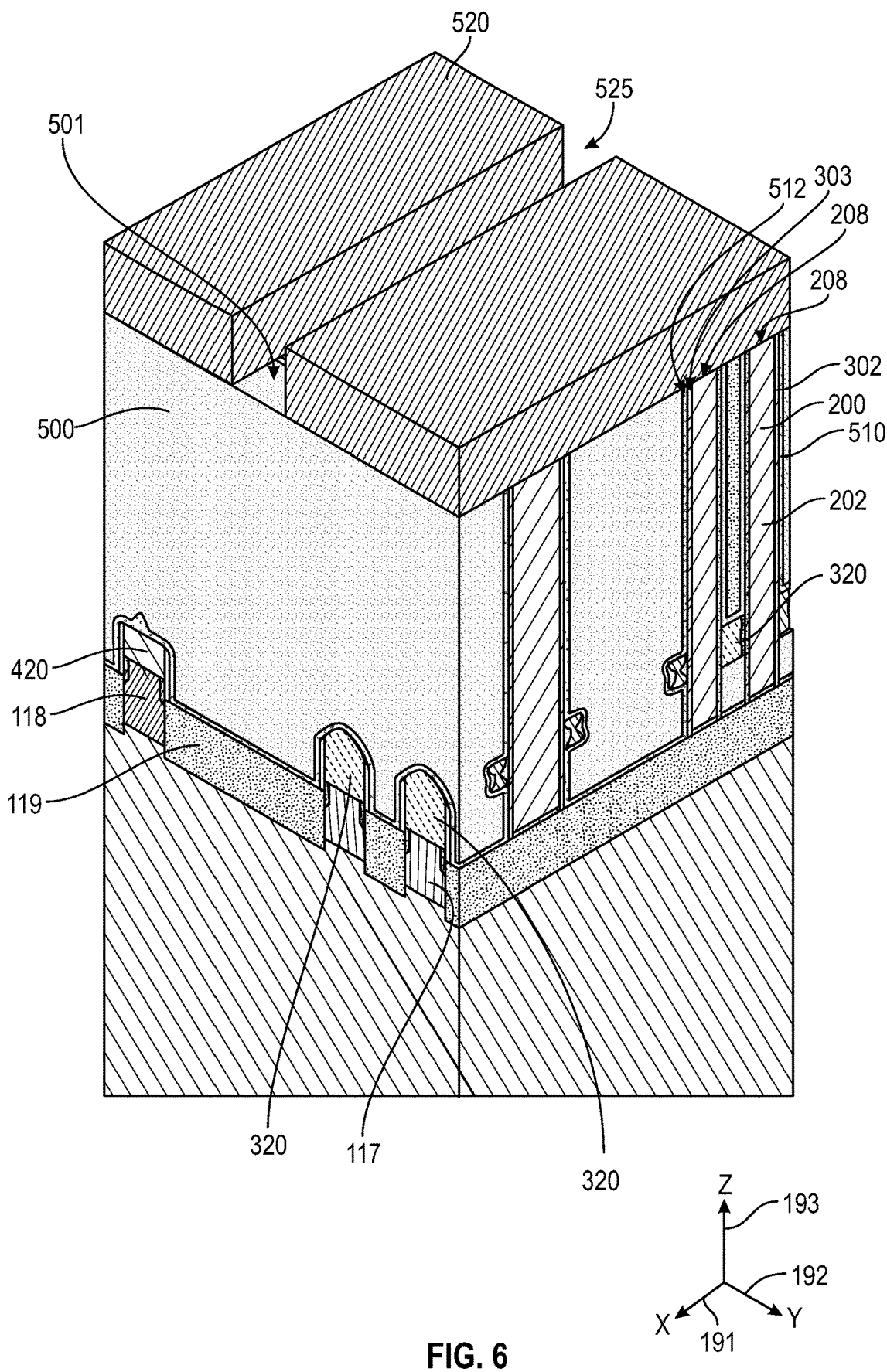

FIG. 6 shows the embodiment of FIG. 5 after formation of an optional gate cut pillar 502 (visible in FIG. 6). The hardmask 204 and hardmask 400 are removed by any suitable technique known to the skilled artisan. An oxide layer 500 is deposited to fill in the spaces between the dummy gates 200. The oxide layer 500 is deposited by any suitable technique known to the skilled artisan including, but not limited to, flowable chemical vapor deposition (FCVD). In some embodiments, the oxide layer 500 is silicon oxide deposited by a blanket deposition process followed by a suitable planarization process (e.g., chemical-mechanical planarization) to expose a top 208 of the dummy gate 200 through the oxide layer 500.

Figure 7:
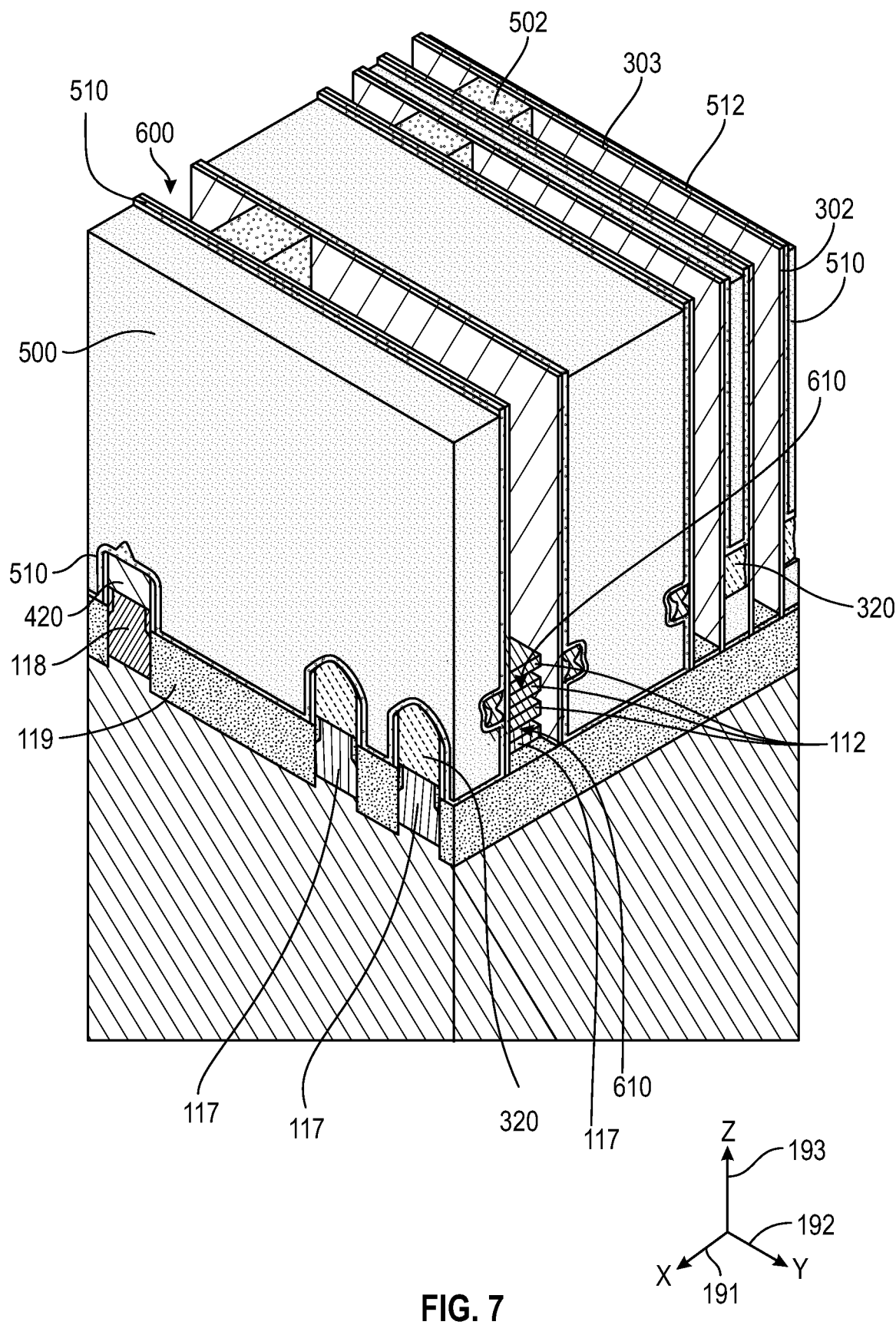

In some embodiments, a liner 510 is deposited on the exposed surfaces after removal of the hardmask 204 and hardmask 400, prior to deposition of the oxide layer 500. The liner 510 is also referred to as a contact etch stop layer (CESL). The liner 510 of some embodiments comprises silicon nitride. The liner 510 of some embodiments is deposited as a conformal layer by atomic layer deposition. In some embodiments, forming the gate cut pillar 502 comprises depositing and patterning a hardmask 520 to form openings 525 to expose a top 501 of the amorphous silicon layer 500 and the top 303 of the sidewall spacer 302 and the top 512 of the liner 510. The gate cut pillar 502 can be any suitable material including, but not limited to, a nitride. In some embodiments, the gate cut pillar 502 formation is omitted so that there is no gate cut pillar in the electronic device. FIG. 7 shows the embodiment of FIG. 6 after several processes have been performed to remove the dummy gate material 202 (e.g., amorphous silicon gate). In embodiments in which a gate cut pillar 502 is formed, the hardmask 520 is removed to expose the top 303 of the sidewall spacer 302, the top 512 of the liner 510 and the top 501 of the oxide layer 500.

Removal of the dummy gates 200 (optionally including the dummy gate material 202), results in the formation of trenches 600. The dummy gates 200 and dummy gate material 202 can be removed by any suitable technique known to the skilled artisan. In some embodiments, the oxide layer 500 is removed by reactive ion etching (RIE). The dummy gate material 202 can be removed by any suitable technique known to the skilled artisan. In some embodiments, the dummy gates 200 are removed by removing the hardmask 204 in a process that is selective to the oxide layer 500 and the dummy gate material 202, and then the dummy gate material 202 is removed in a process that is selective to the oxide layer 500. In some embodiments, removal of the dummy gate material 202 removes less than 50% of the oxide layer 500.

The second material 114 layers (nanosheets) are removed through the trenches 600. The layers are masked to open the I/O regions while protecting the non-I/O regions to allow for preparation of the I/O regions as shown. Etching the layers of second material 114 from the plurality of fins 110 through the trenches 600 creates alternating first material 112 layers and openings 610 bounded on either side along the first direction 191 by the inner spacer 116. The second material 114 can be removed by any suitable technique known to the skilled artisan. In some embodiments, the second material 114 is selectively etched relative to the first material 112. Removing the second material 114 allows for filling of the gaps between the nanosheets. In some embodiments, the removal of the second material 114 allows for formation of a pure silicon device. In some embodiments, the first material comprises crystalline silicon (Si) and the second material comprises silicon germanium (SiGe), and removal of the SiGe is done using an etch process that is selective the crystalline Si.

Each of FIGS. 7 through 11 illustrate electronic devices following a similar pattern of six views. The 'A' view of each Figure presents an isometric view of an electronic device according to one or more embodiments of the disclosure. The 'B' through 'F' views illustrate slices of the electronic device shown in the 'A' view taken along the lines indicated in FIG. 7A. In each Figure, the 'B' view shows a slice of the electronic device of the 'A' view where a non-I/O gate is shown. In each Figure, the 'C' view shows a slice of the electronic device of the 'A' view where an I/O gate is shown. In each Figure, the 'D' view shows a slice of the electronic device of the 'A' view where the source-drain non-I/O are shown. In each Figure, the 'E' view shows a slice of the electronic device of the 'A' view where a pFET is shown. In each Figure, the 'F' view shows a slice of the electronic device of the 'A' view where an nFET is shown. For ease of viewing, the lines representing the 'B' through 'F' slices are only shown on FIG. 7A but the skilled artisan will recognize these views in each of FIGS. 8 through 11. Reference to a Figure number without the following letter refers to all six views of the indicated Figure. For example, reference to FIG. 7 refers to all of FIGS. 7A through 7F.

Figure 8A:
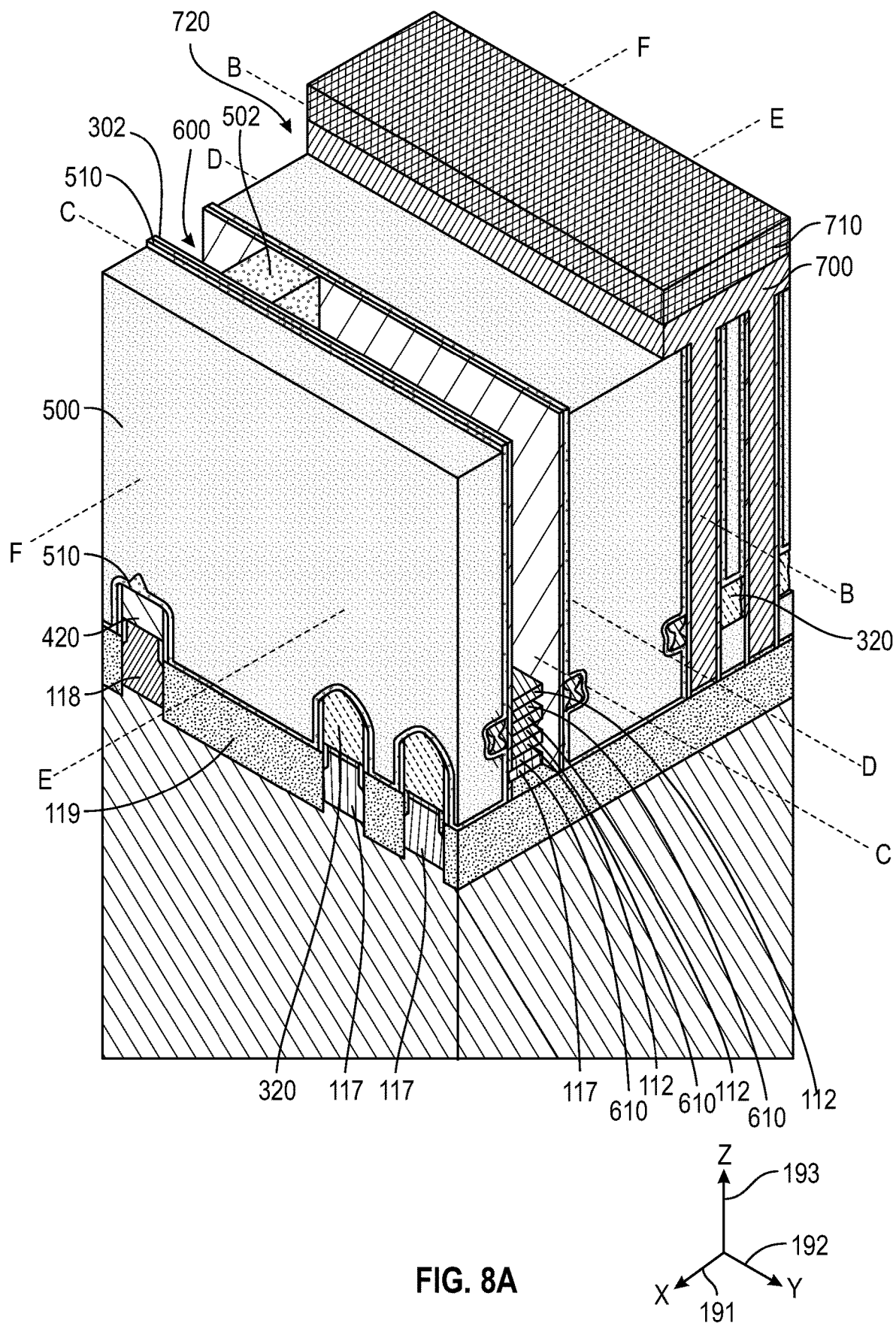
Figure 8B:
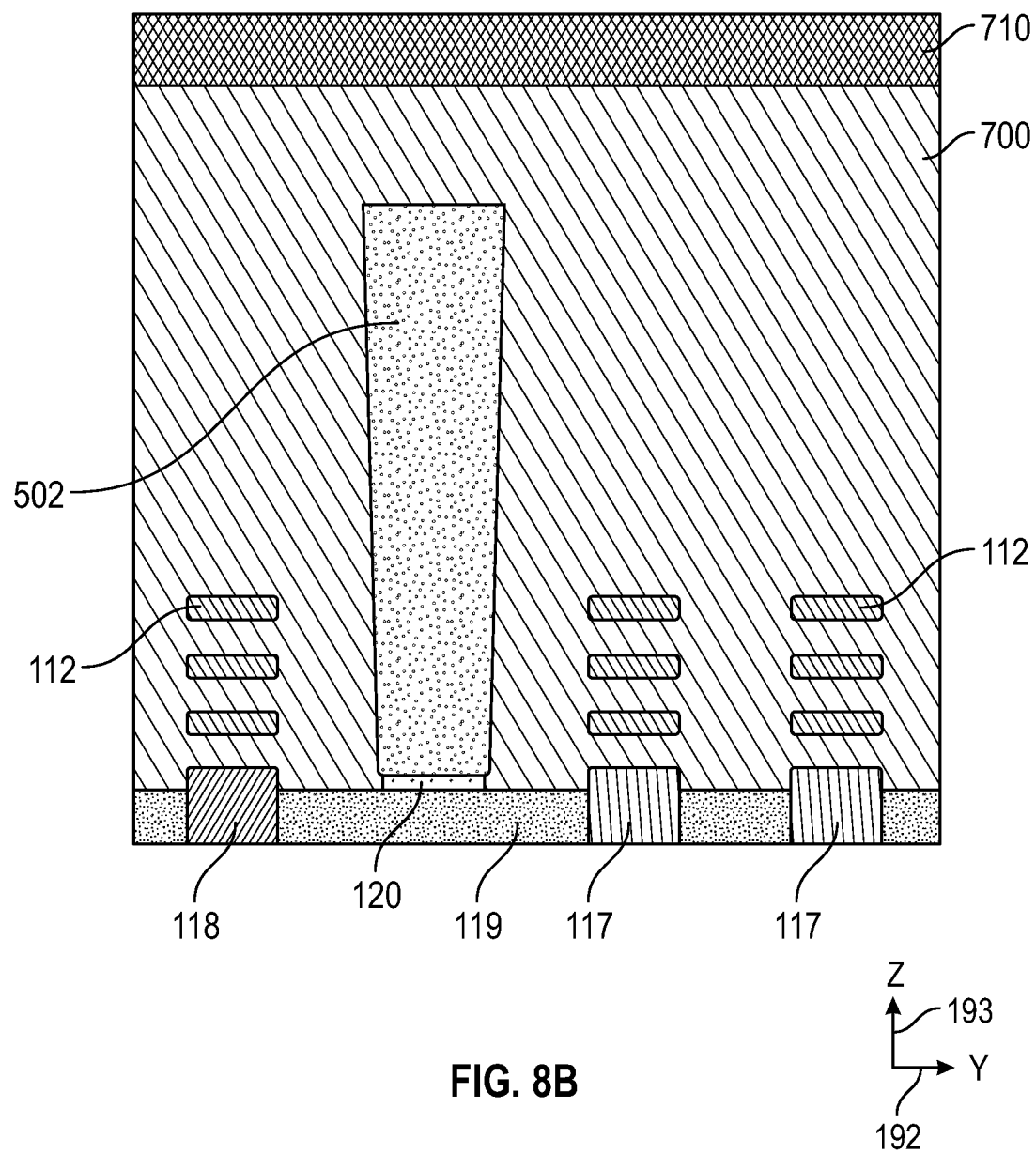
Figure 8C:
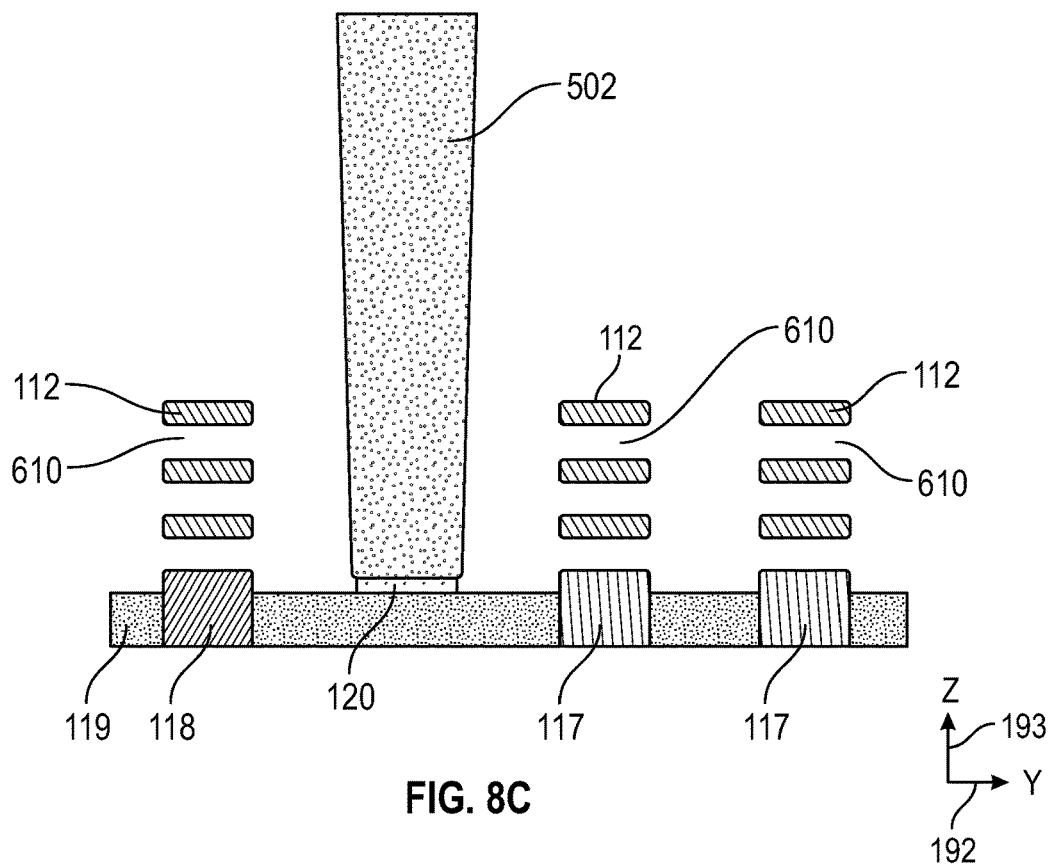
Figure 8D:
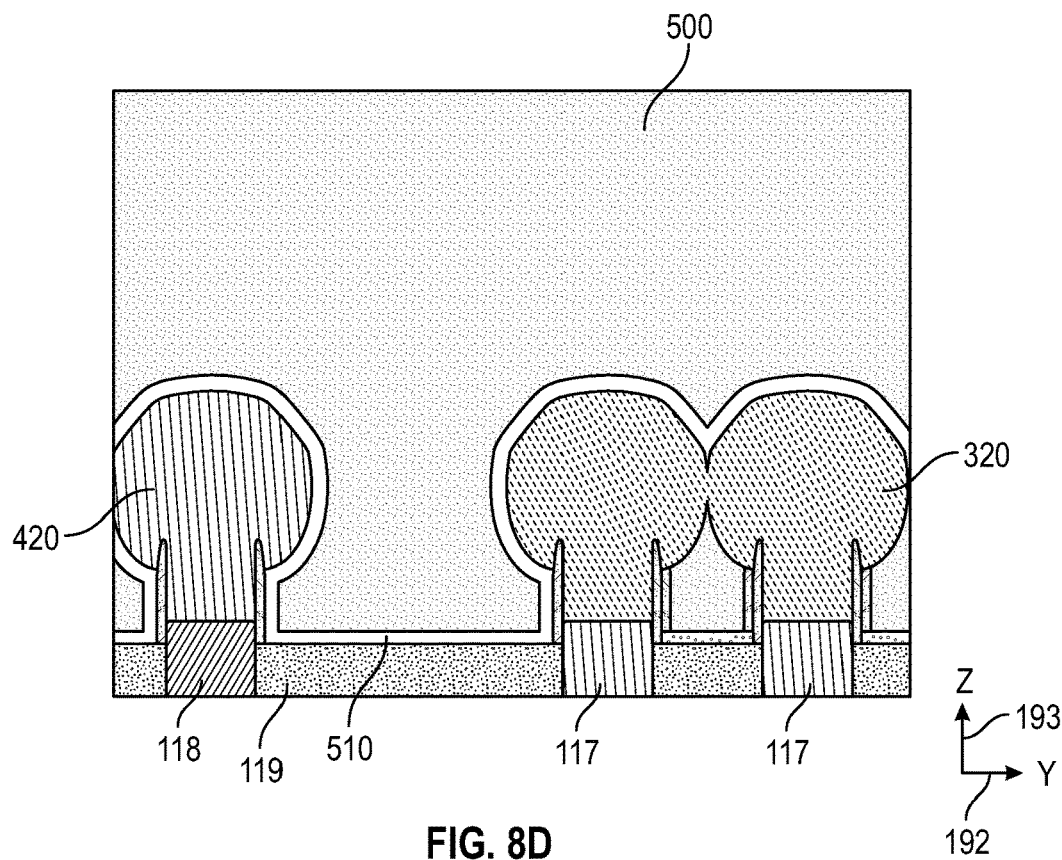

FIG. 8A shows the embodiment of FIG. 7 after deposition of a spin-on-hardmask (SOH) 700 and a hardmask layer 710. The SOH 700 can be any suitable hardmask deposited by any suitable technique. In some embodiments, the SOH 700 comprises or consists essentially of spin-on-carbon (SOC). The hardmask layer 710 can be any suitable material including, but not limited to silicon oxynitride (SiON) and deposited by any suitable technique known to the skilled artisan.

Figure 8E:
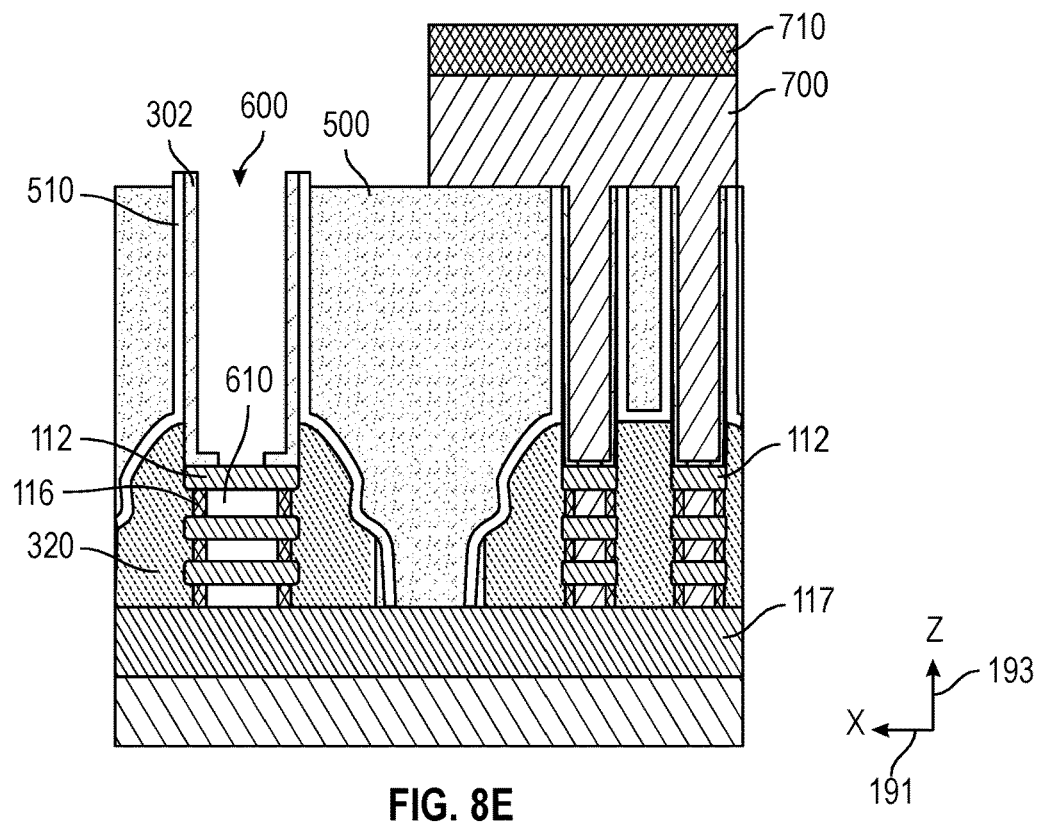
Figure 8F:
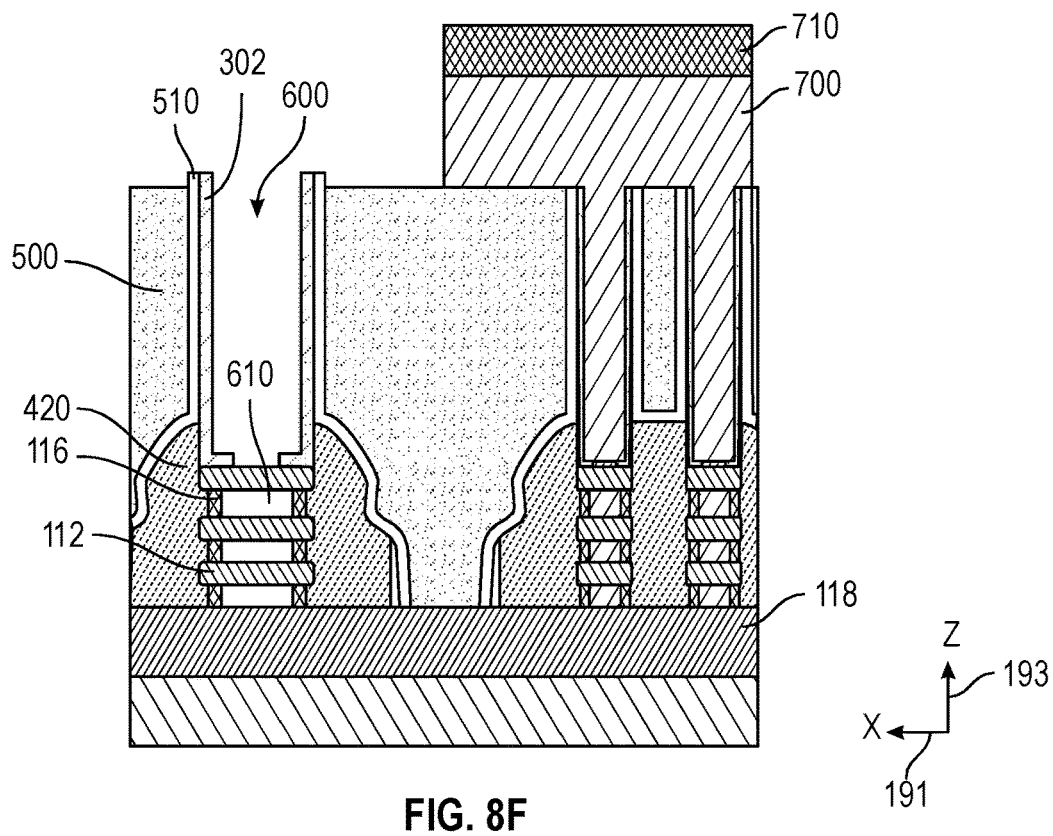
Figure 9A:
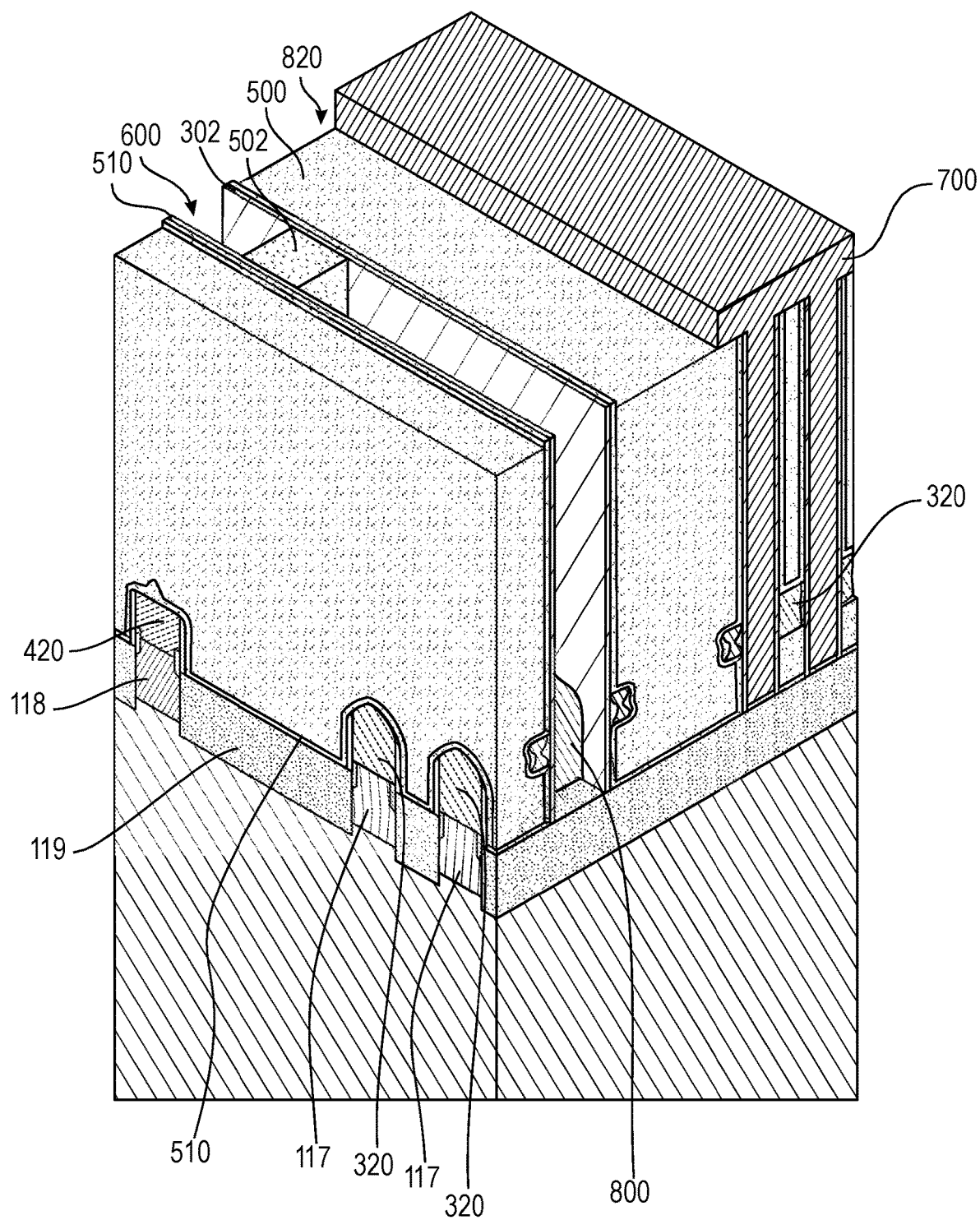
Figure 9B:
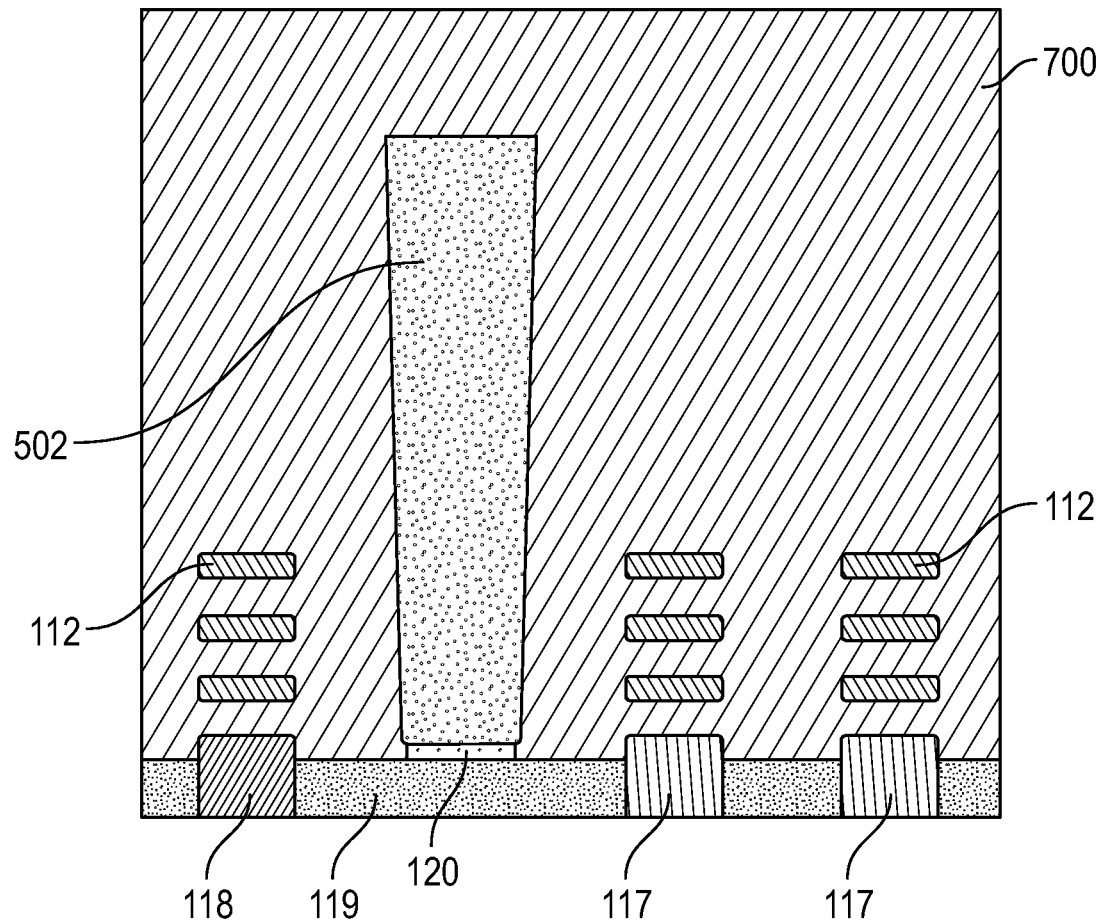
Figure 9B:
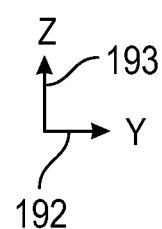
Figure 9C:
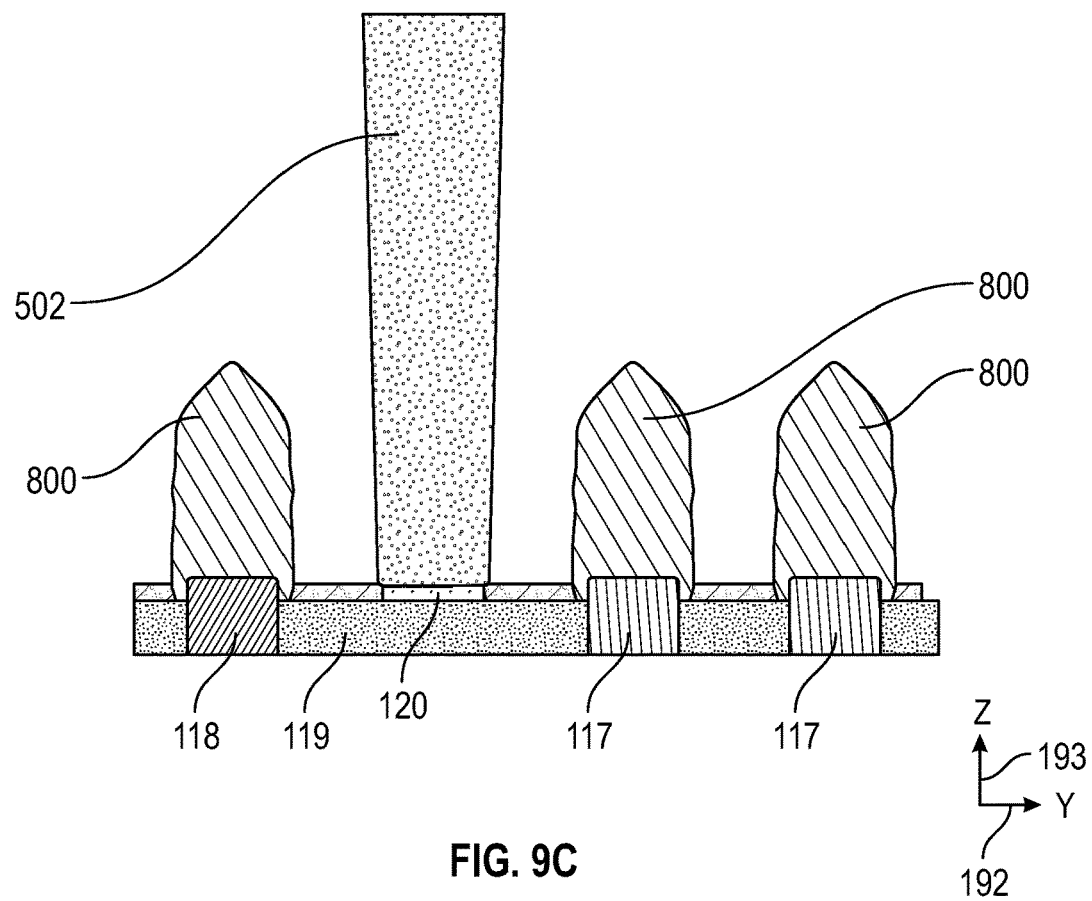
Figure 9D:
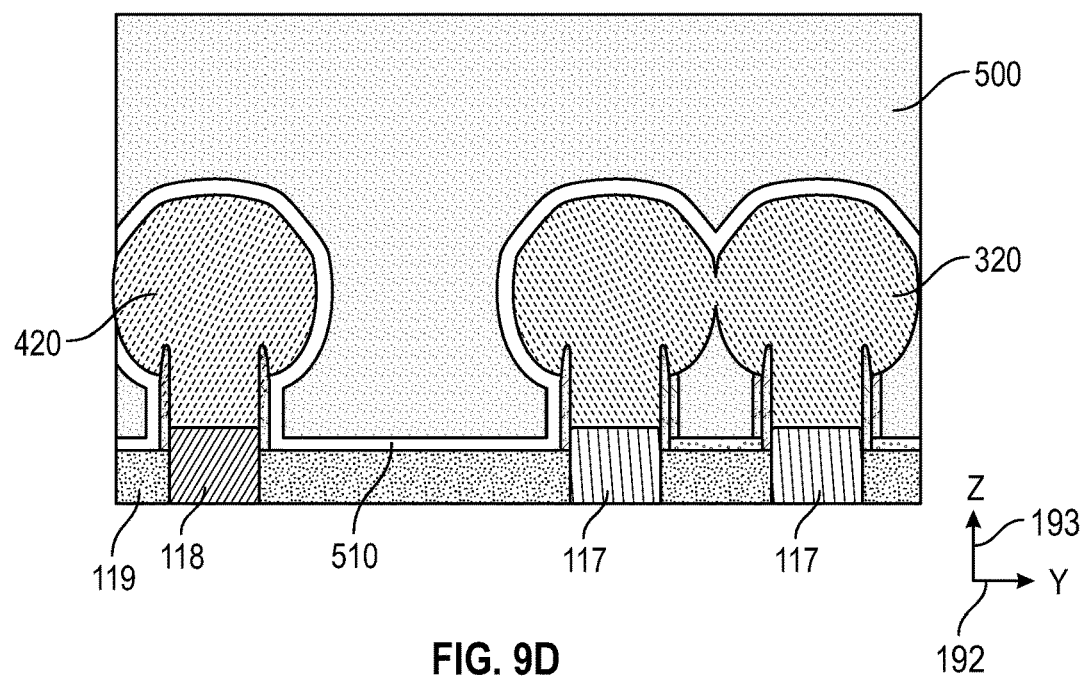
Figure 9E:
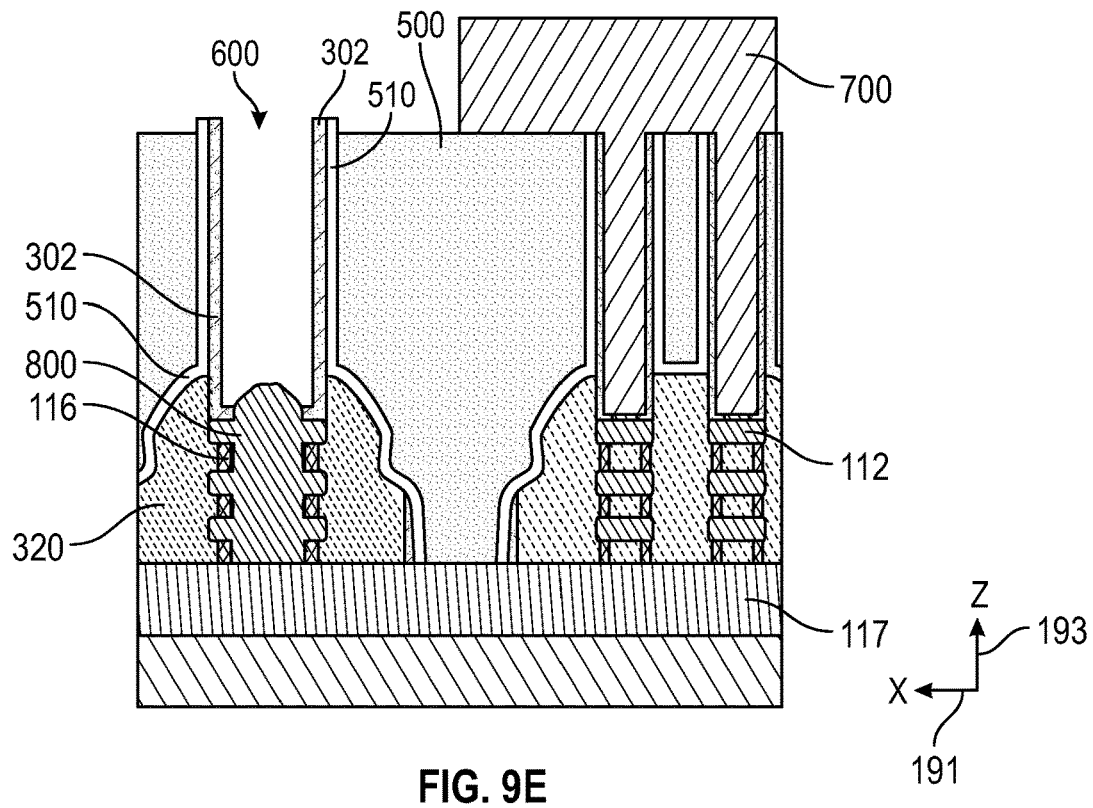
Figure 9F:
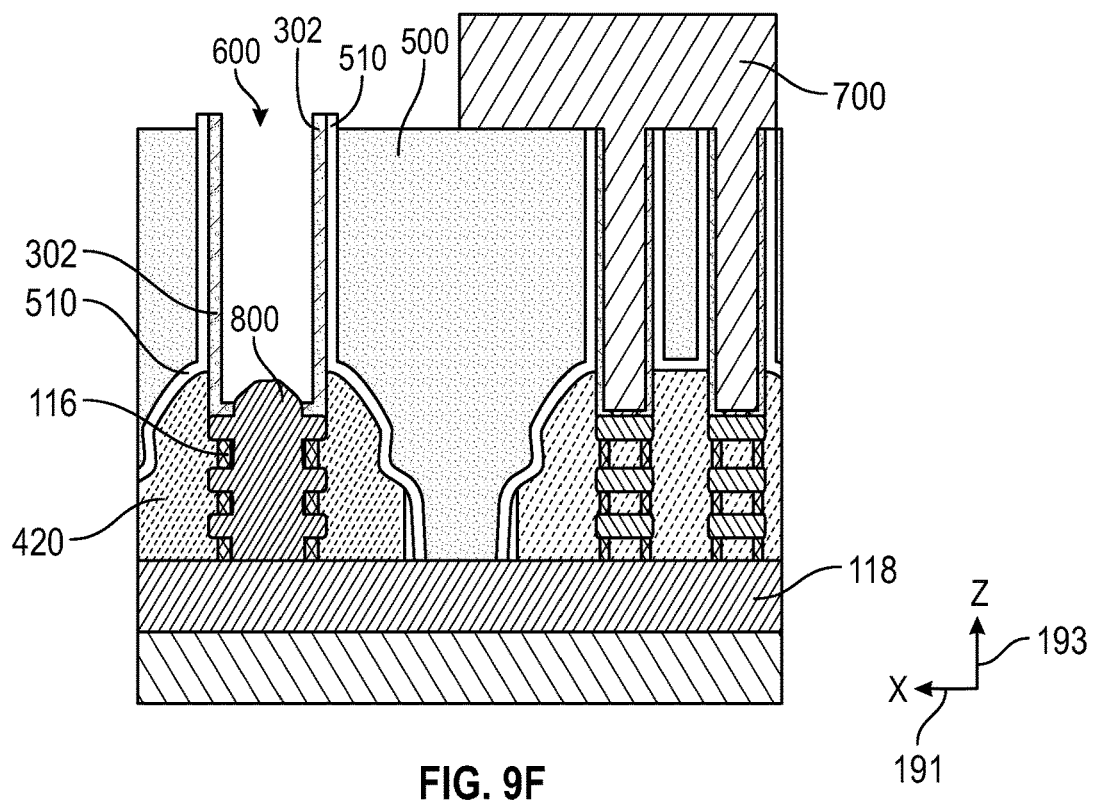
Figure 10A:
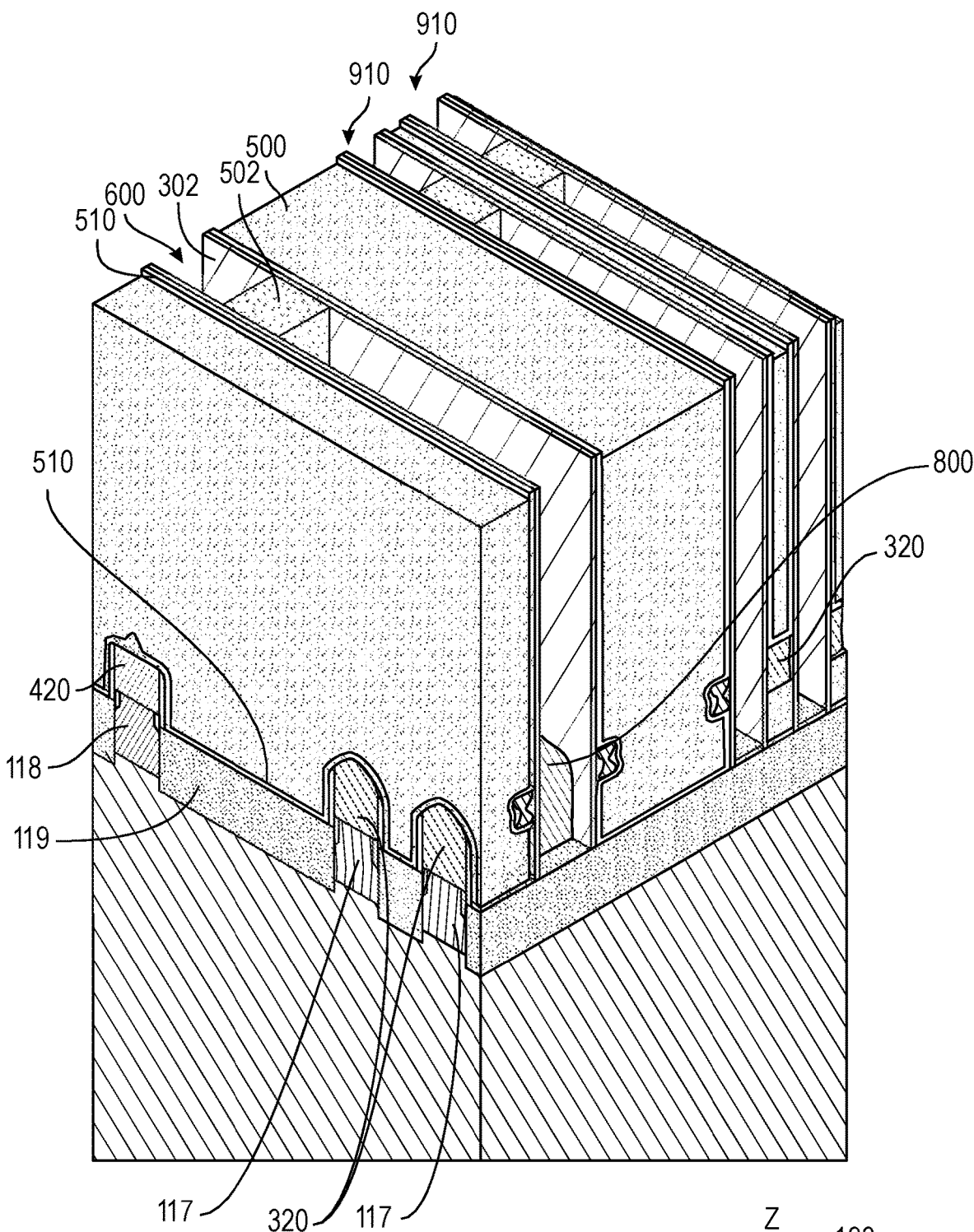
Figure 10B:
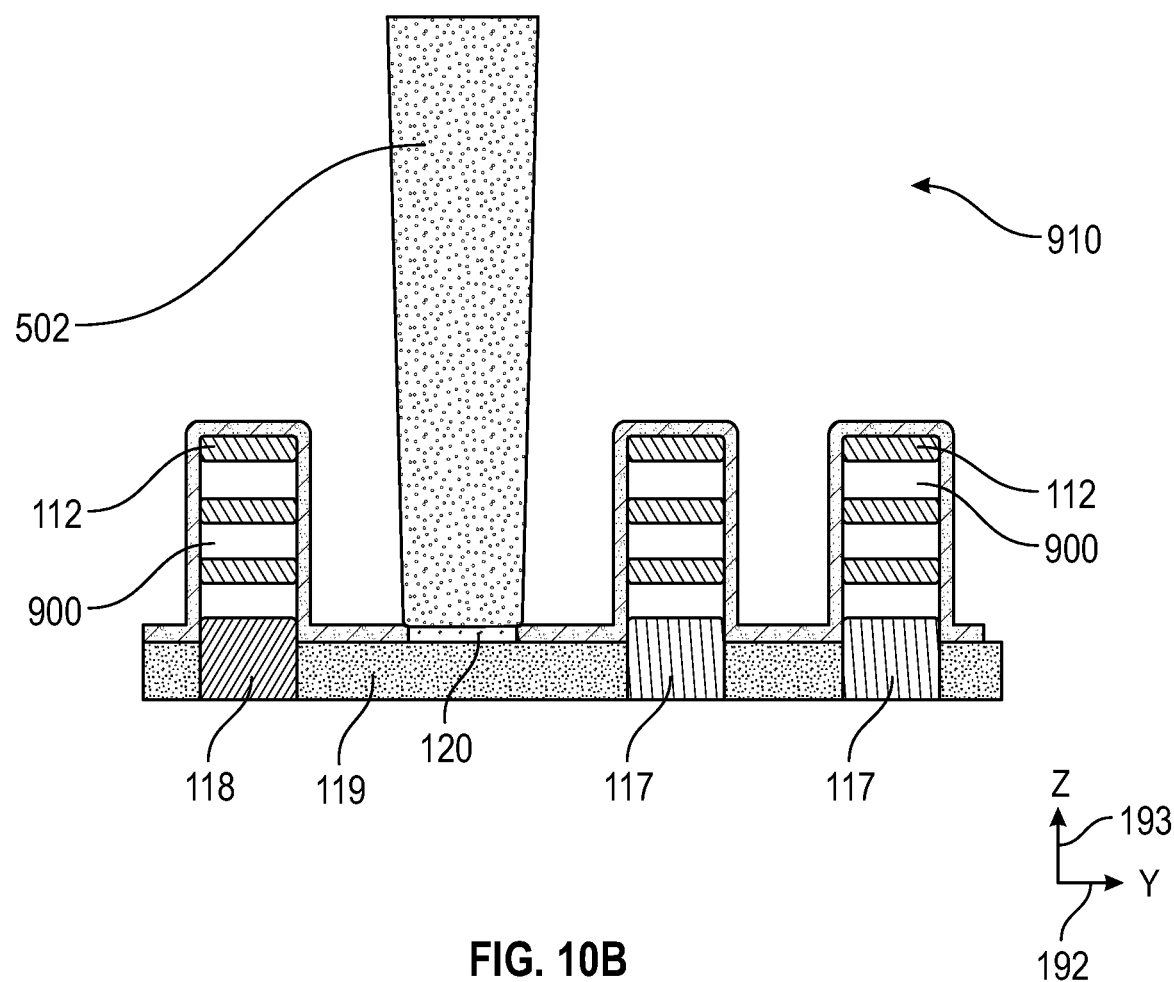
Figure 10C:
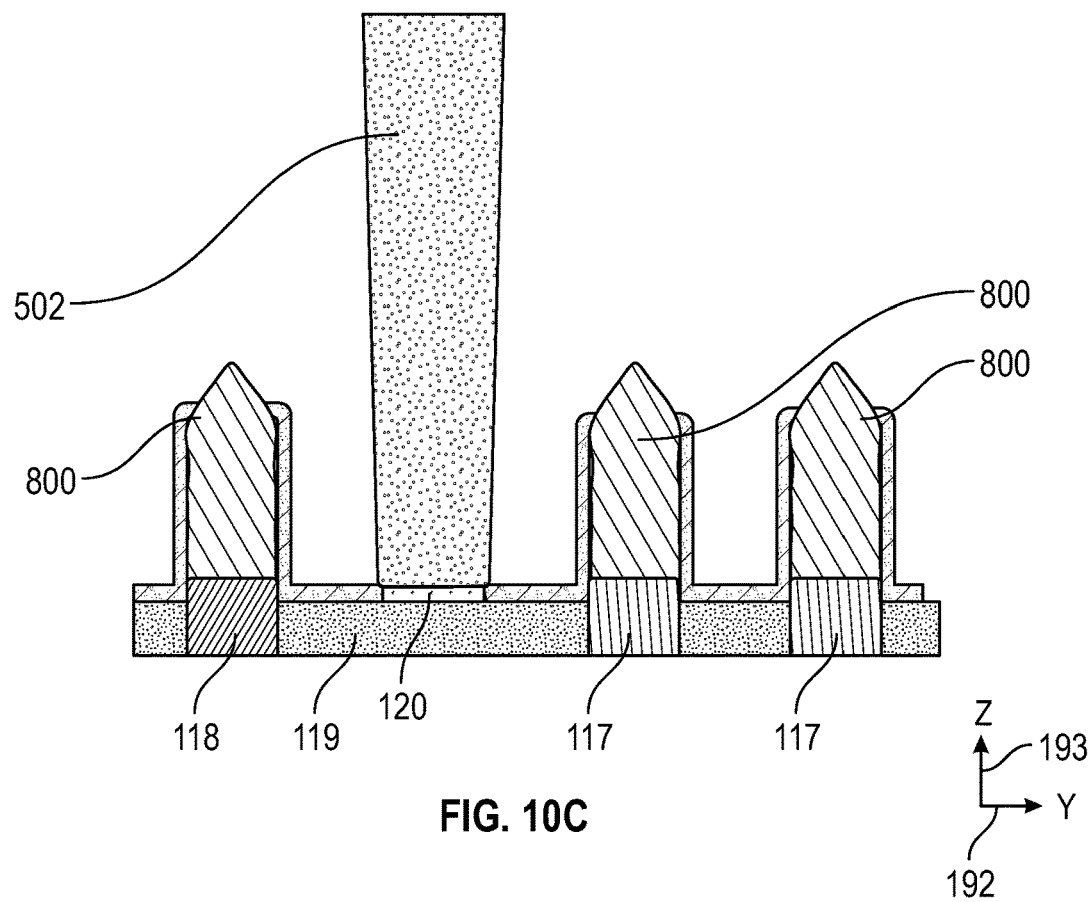
Figure 10D:
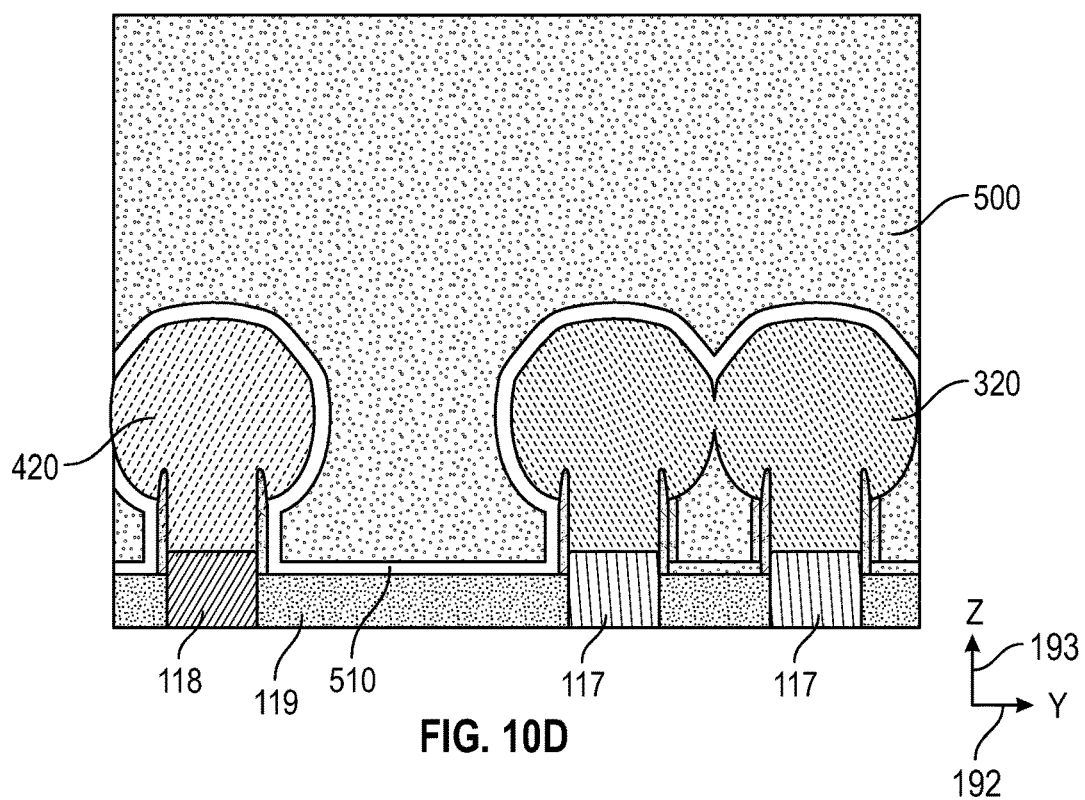
Figure 10E:
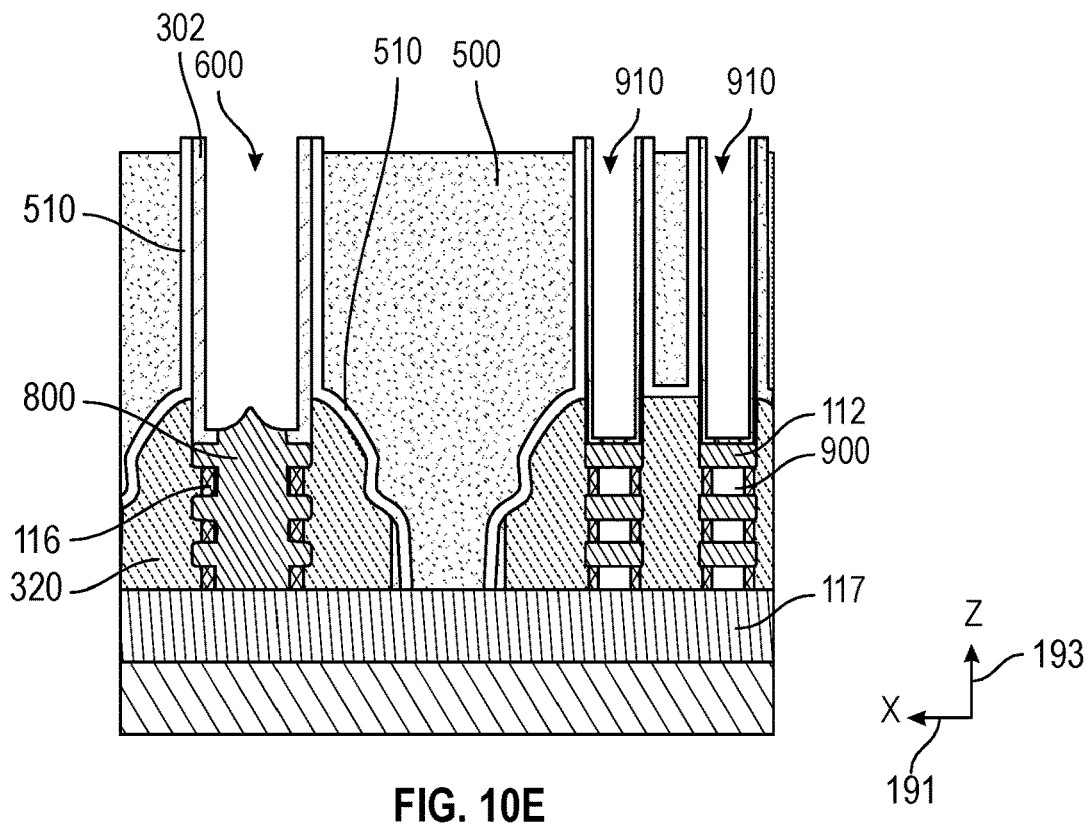
Figure 10F:
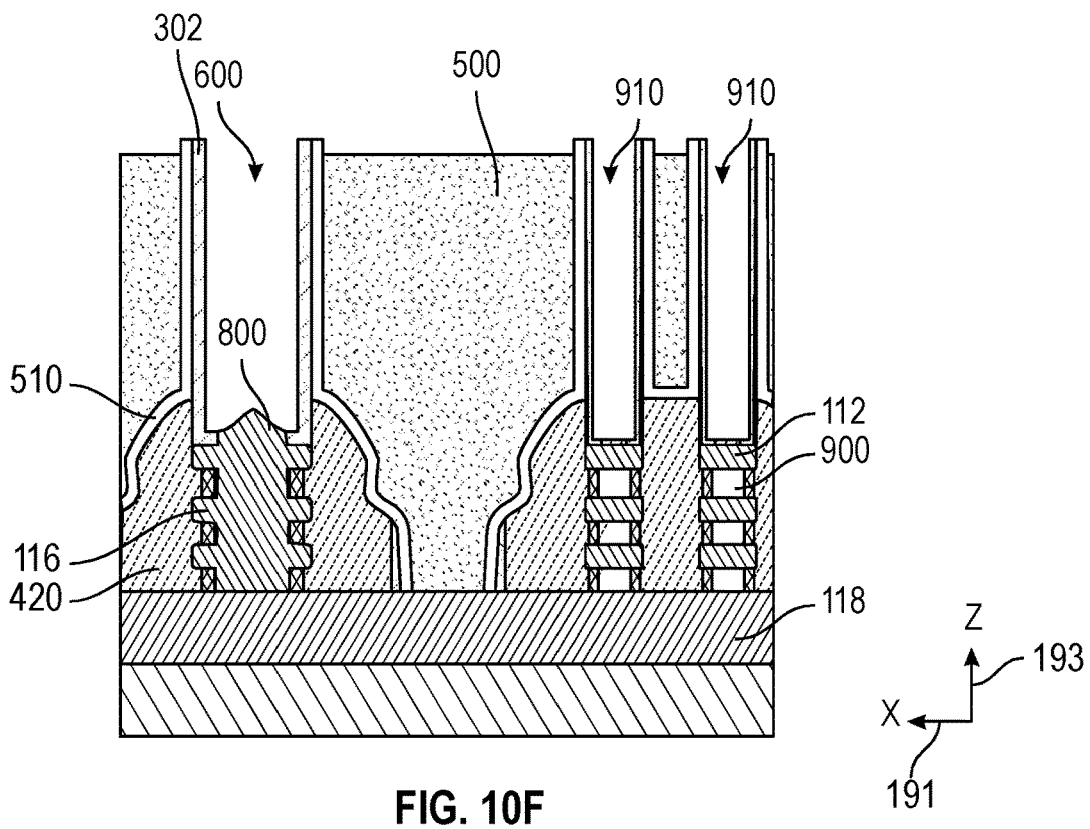
Figure 11A:
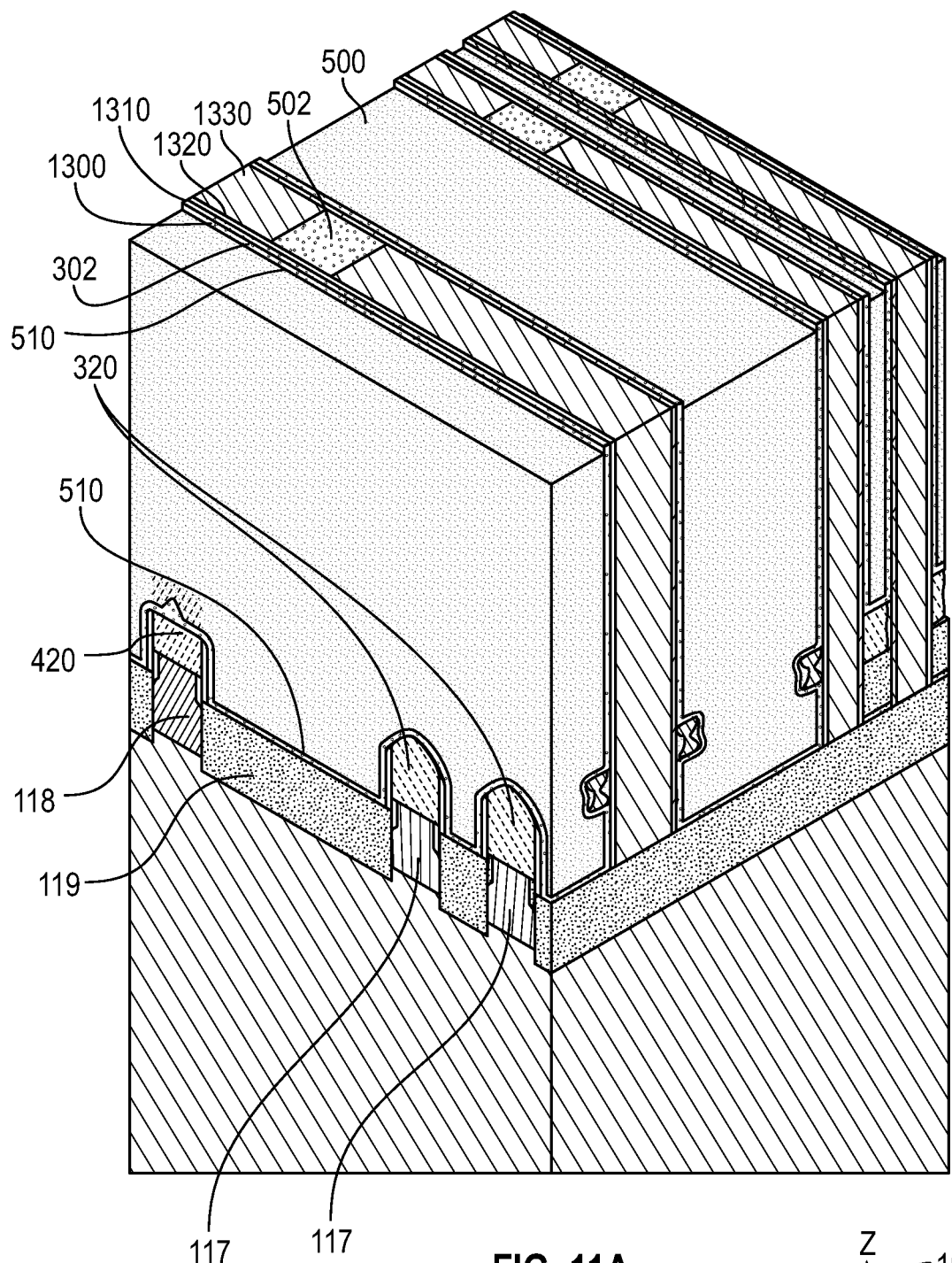
Figure 11B:
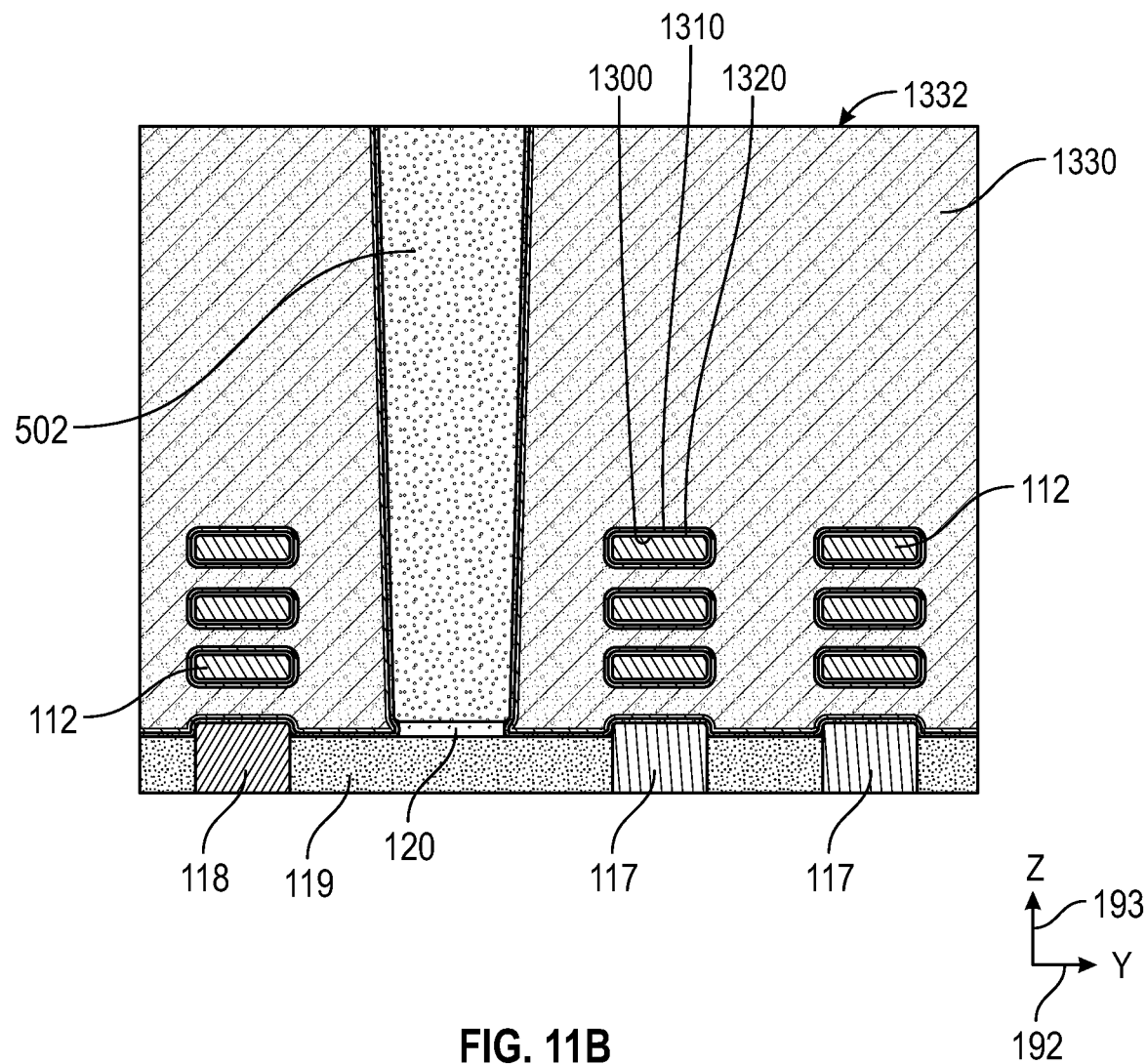
Figure 11C:
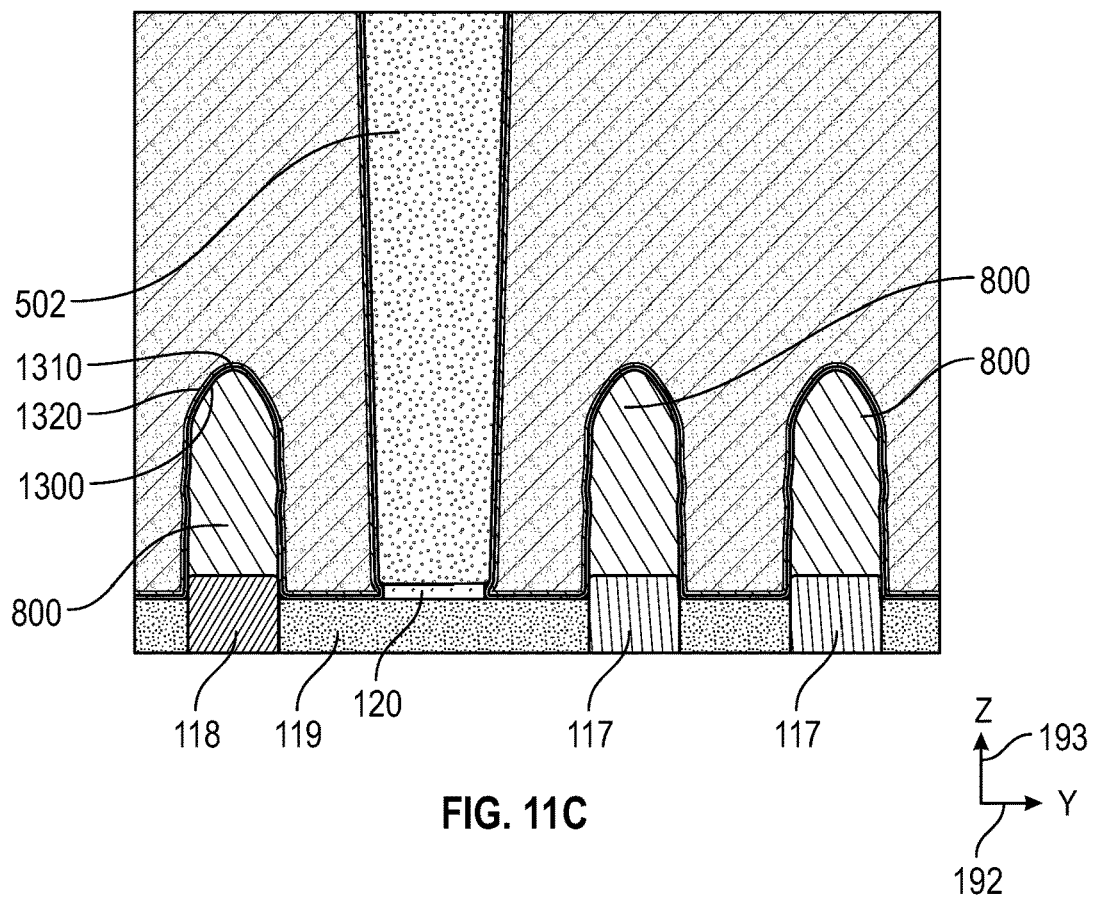
Figure 11D:
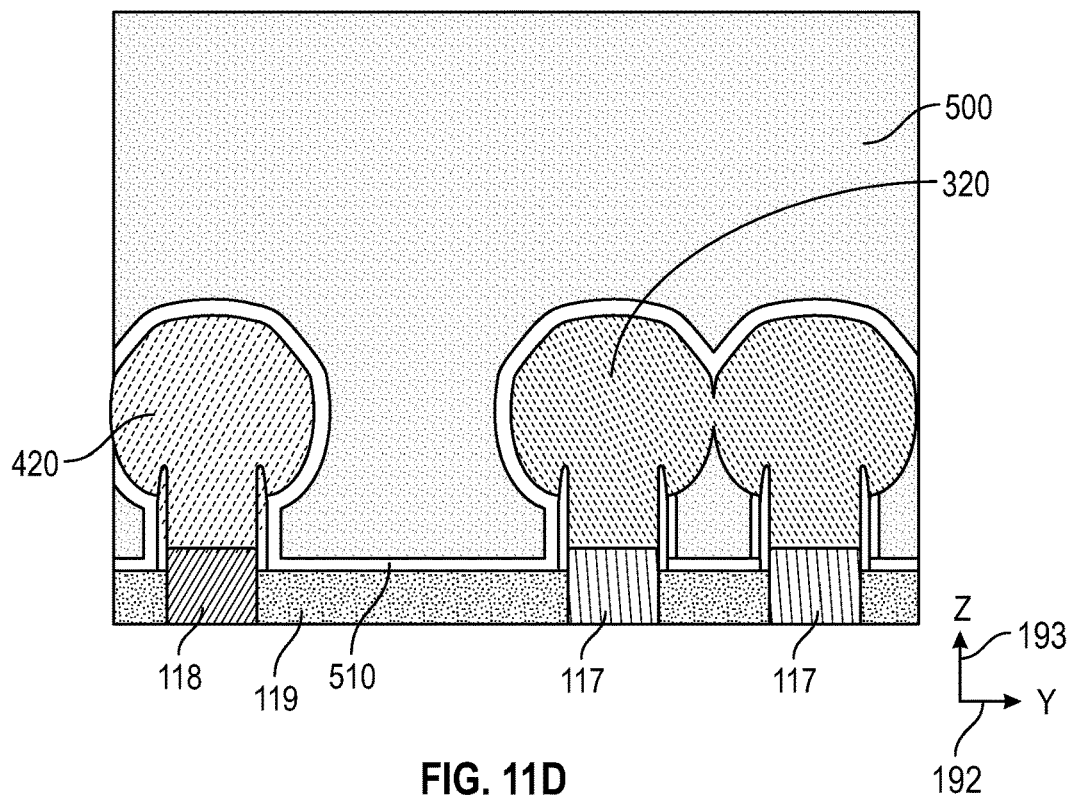
Figure 11E:
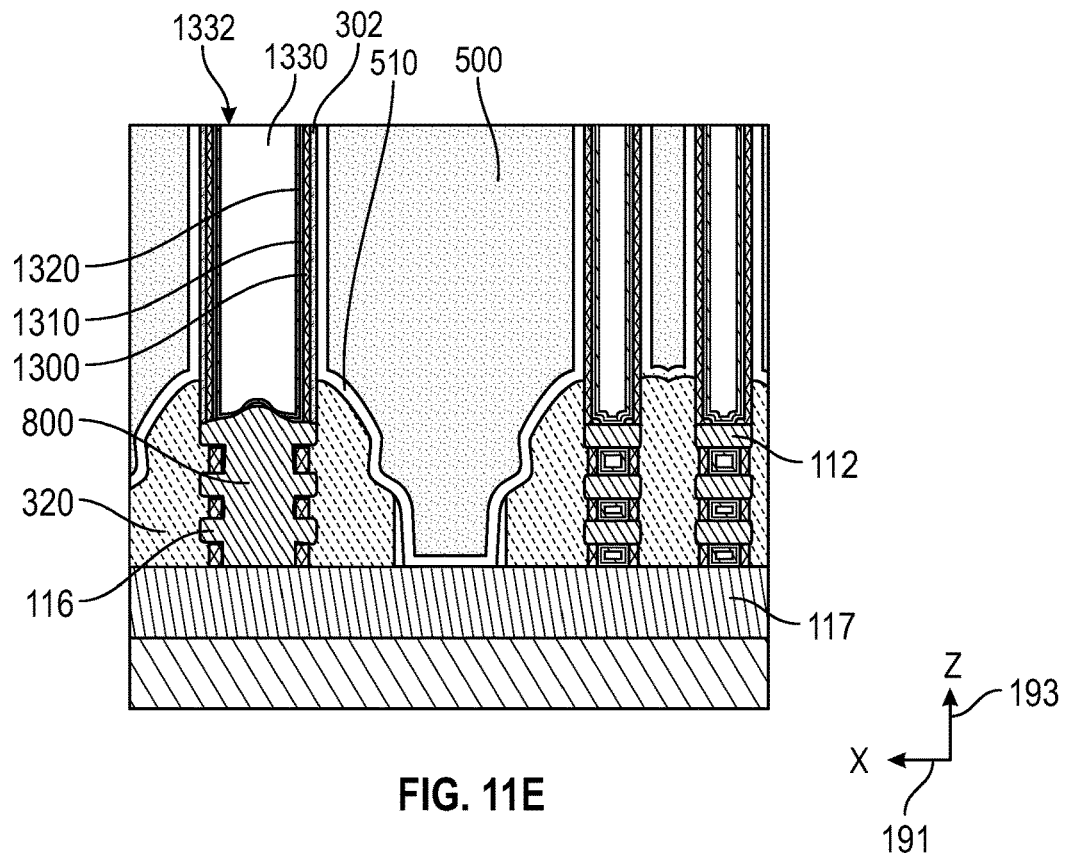
Figure 11F:
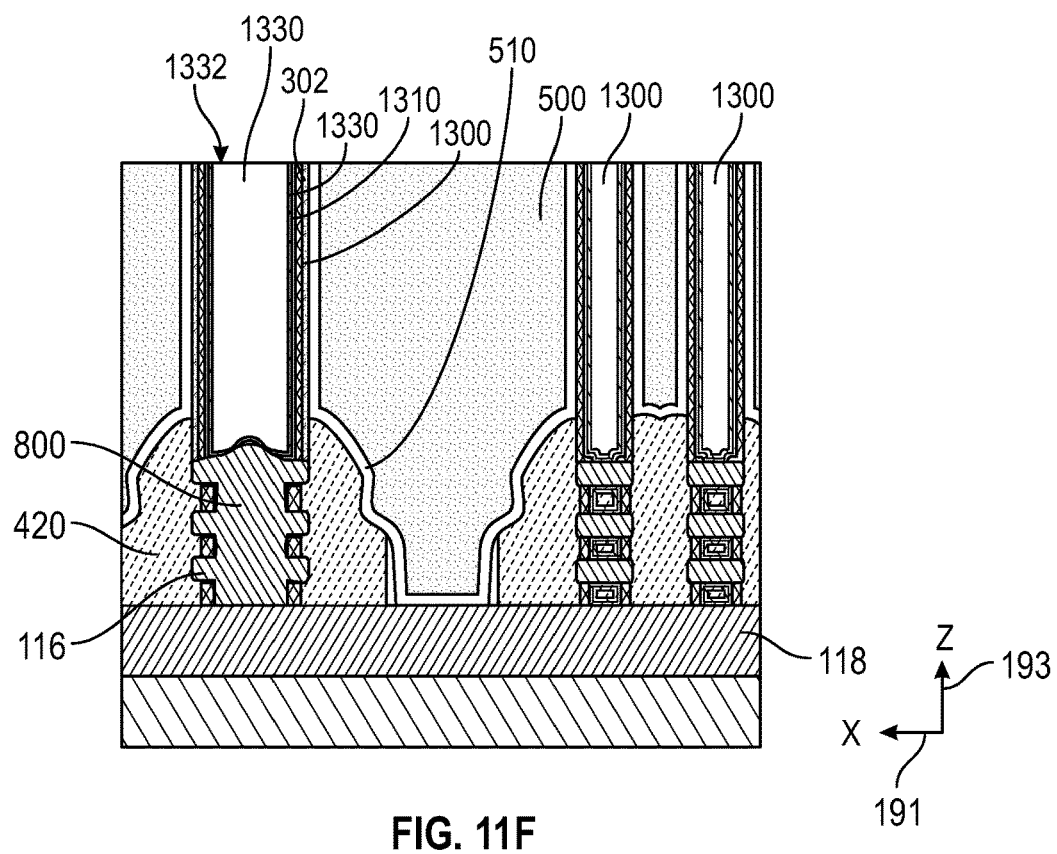

An opening 720 is formed through the hardmask layer 710 and the SOH 700. The opening exposes the I/O region of the electronic device while protecting the transistor gates. The opening 720 can be formed by any suitable technique known to the skilled artisan. In some embodiments, an additional hardmask is deposited on top of the resist and patterned. To form an opening in the additional hardmask. The opening is then transferred into the hardmask layer 710 and SOH 700. In some embodiments, the opening 720 is formed by masking and etching the hardmask layer 710 and the SOH 700 through openings in the additional mask. In some embodiments, the hardmask layer 710 and SOH 700 are etched at the same time. In some embodiments, the hardmask layer 710 and SOH 700 are etched using different processes. The opening 720 of some embodiments is formed over the pFET and nFET regions of the electronic device, as shown in FIGS. 8E and 8F, respectively.

FIG. 9 shows the embodiment of FIG. 8 after removing the hardmask layer 710 and performing an epitaxial regrowth process on the first material 112 through opening 600. The epitaxial regrowth process of some embodiments is a selective epitaxy process. In some embodiments, the selective epitaxy process epitaxially grows the first material 112 layers through the opening 600 (also referred to as trenches). The epitaxial growth of some embodiments causes the first material 112 layers to merge into a contact 800 of the first material 112. In some embodiments, the first material 112 comprises silicon and the epitaxy causes the nano-slabs of first material 112 to merge and pinch off the openings 610. In some embodiments, the epitaxy process causes growth of Si<100>. In some embodiments, the epitaxy process causes growth of Si<110>. In some embodiments, the epitaxy process causes the contacts 800 to have a conical shape (as shown in FIG. 9C) flat topped or a frustoconical shape (as shown in FIG. 9E).

FIG. 10 shows the embodiment of FIG. 9 after an etch process to trim the fins (contacts 800), and stripping the hardmask layer 710 through trenches 910. In some embodiments, the etch process occurs after shaping the I/O device through a cyclic epitaxial growth-etch process. In some embodiments, the etch process comprises an HCl etchback process. In some embodiments, the etchback process increases the verticality of the sidewalls. In some embodiments, the etchback process reshapes the nanoslabs to decrease the severity of a point formed on the top of the contacts 800 to form a finlike structure (finFET) made of crystalline silicon for the I/O devices. In some embodiments, the contacts 800 are reshaped by repeated sequential growth and etch processes followed by removal of the SOH 700 to create openings 910.

FIG. 11 shows the embodiment of FIG. 10 after several processes. An interlayer dielectric 1300 is formed on the exposed surfaces. The interlayer dielectric 1300 of some embodiments is a conformal film deposited by atomic layer deposition. The interlayer dielectric 1300 can be any suitable material known to the skilled artisan.

After formation of the interlayer dielectric 1300, a high-k dielectric 1310 is formed on the interlayer dielectric 1300. The high-k dielectric 1310 can be any suitable material known to the skilled artisan. In some embodiments, the high-k dielectric 1310 comprises or consists essentially of hafnium oxide. In some embodiments, the high-k dielectric is a conformal film deposited by atomic layer deposition.

An optional work-function metal (WFM) 1320 is formed on the high-k dielectric 1310. The optional work-function metal 1320 can be any suitable material known to the skilled artisan deposited by any suitable technique. In some embodiments, the work-function metal 1320 is a conformal film deposited by atomic layer deposition or physical vapor deposition.

A gate metal 1330 is formed on the optional work function metal 1320. The gate metal can be any suitable material deposited by any suitable technique. In some embodiments, the gate metal 1330 comprises one or more of cobalt, tungsten, copper, molybdenum or ruthenium. In some embodiments, the gate metal 1330 is deposited by a blanket deposition process. In some embodiments, the gate metal 1330 is deposited by one or more of atomic layer deposition, chemical vapor deposition or physical vapor deposition.

After formation of the gate metal 1330, the electronic device is planarized to lower the surface 1332 of the gate metal 1330 to expose the top surface 501 of the amorphous silicon layer 500. In some embodiments, planarization is performed by etching or chemical-mechanical planarization (CMP).

FIG. 12 shows the embodiment of FIG. 11 after formation of various contacts. The skilled artisan will understand the processes for patterning and forming the various contacts. Briefly, in some embodiments, a hardmask layer and a resist are formed and patterned by any suitable technique(s).

Etching through openings in the patterned mask opens holes for the contacts. In some embodiments, the etch process comprises an anisotropic etch process. In some embodiments, the etch process creates openings and is selective for the pFET and nFET.

The interlayer dielectric 1300 is removed and a metal layer is deposited and planarized. The interlayer dielectric 1300 can be removed by any suitable technique known to the skilled artisan. In some embodiments, the metal layer 1700 comprises the same material as the gate metal 1330. In some embodiments, the metal layer 1700 comprises one or more of cobalt, tungsten, copper or ruthenium. After deposition of the metal layer 1700, the electronic device is planarized to lower the surface 1702 of the metal layer 1700 to expose the top surface 501 of the amorphous silicon layer 500. In some embodiments, planarization is performed by etching or chemical-mechanical planarization (CMP).

Figure 12A:
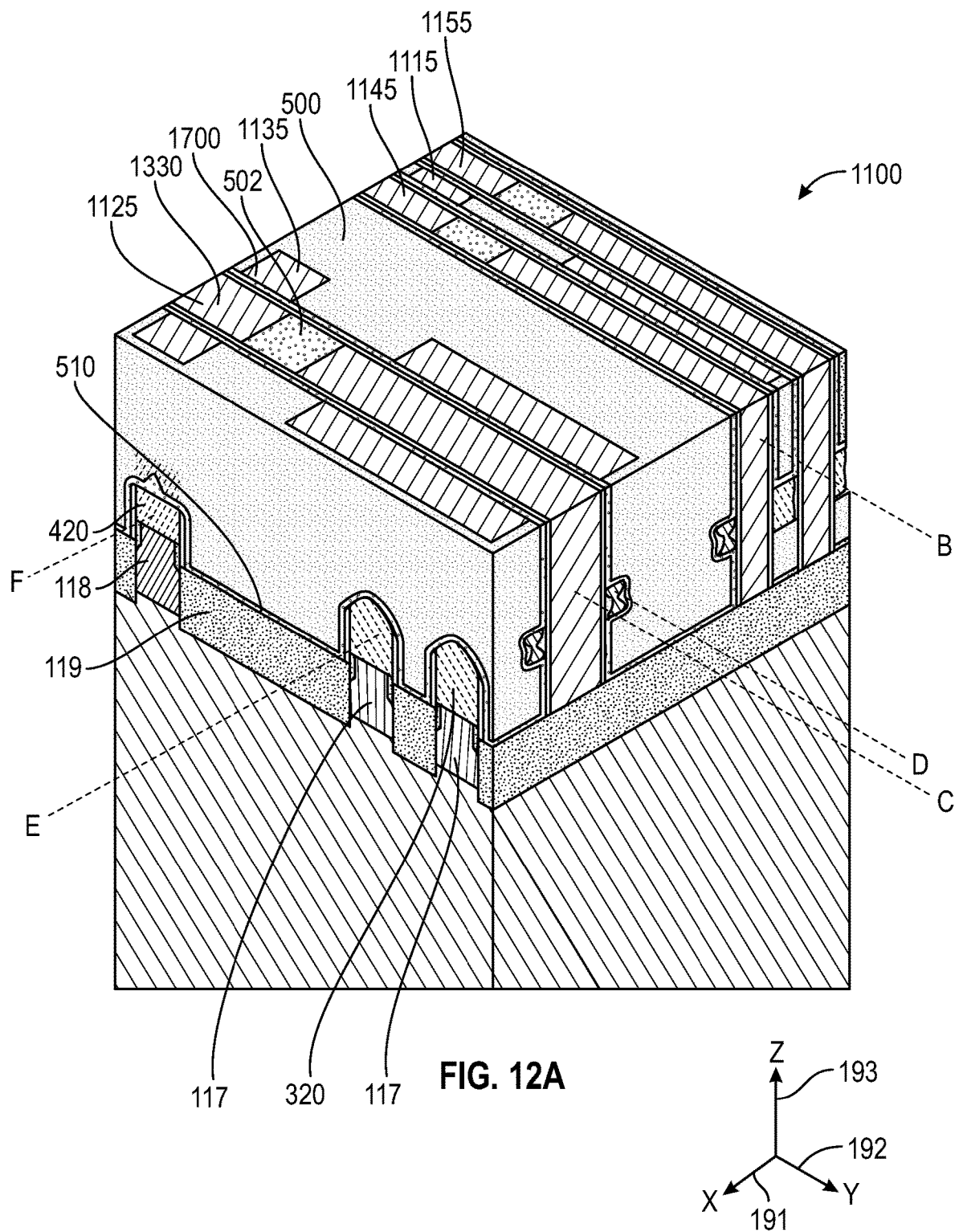
FIGS. 12A through 12F illustrate an electronic device according to one or more embodiment of the disclosure.
Figure 12B:
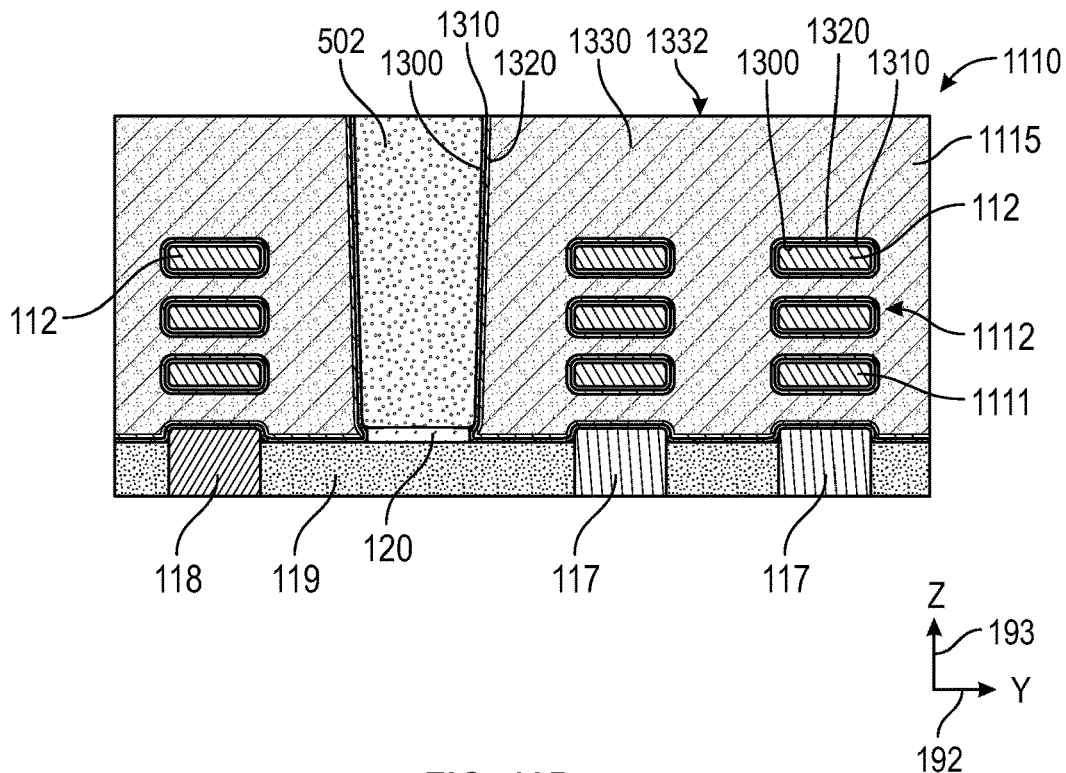
Figure 12C:
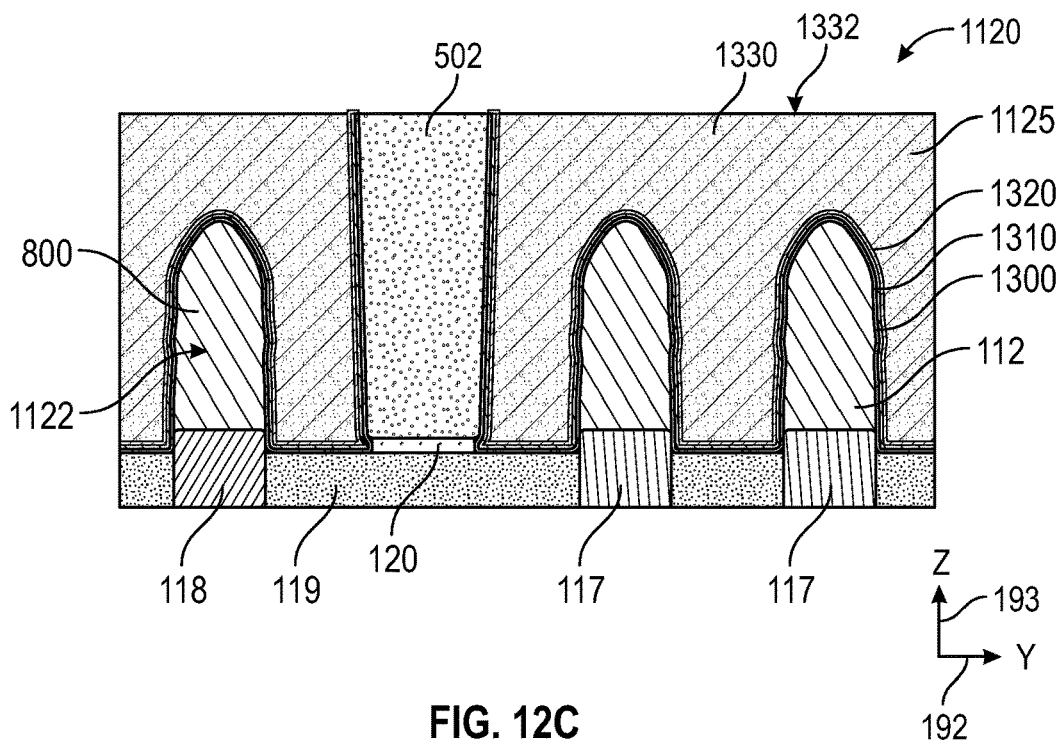
Figure 12D:
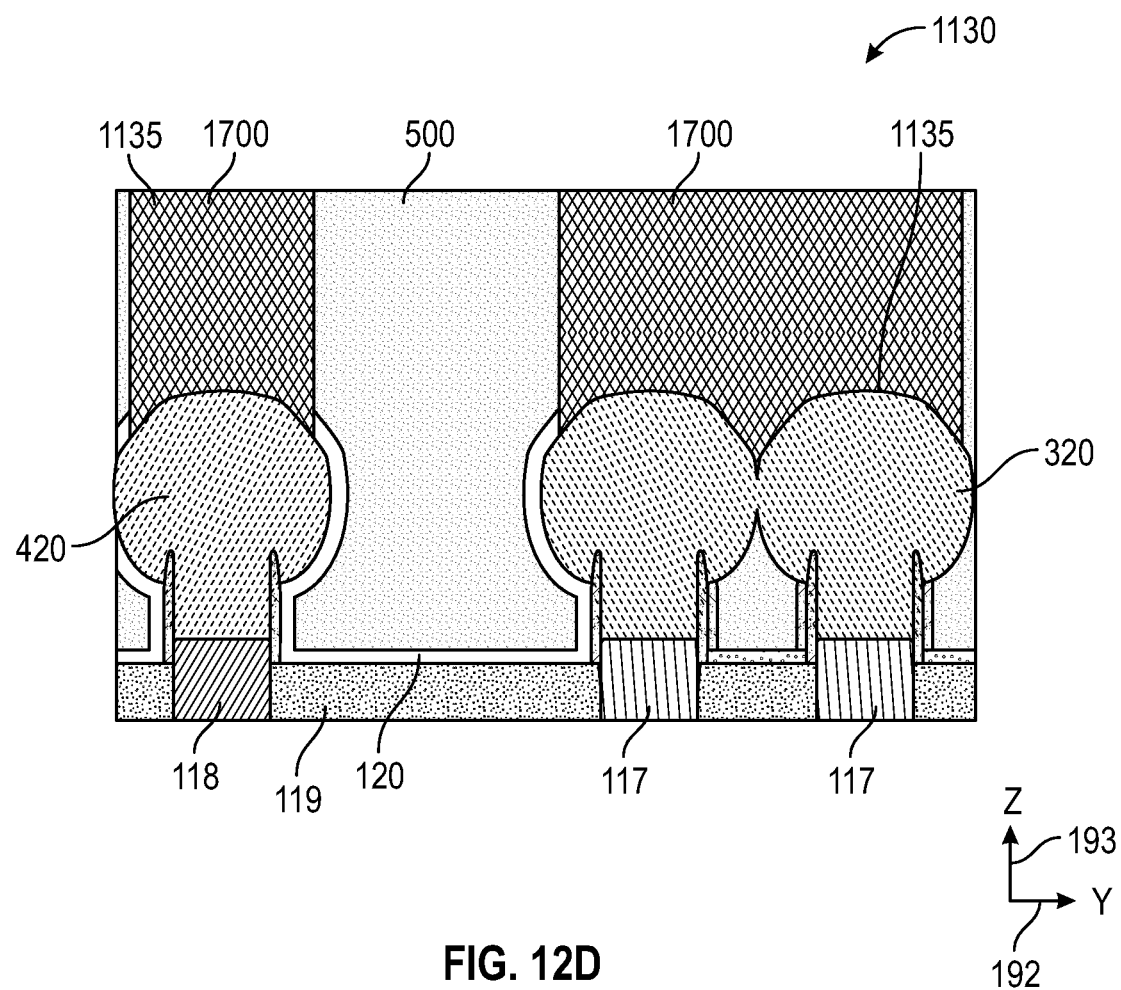
Figure 12E:
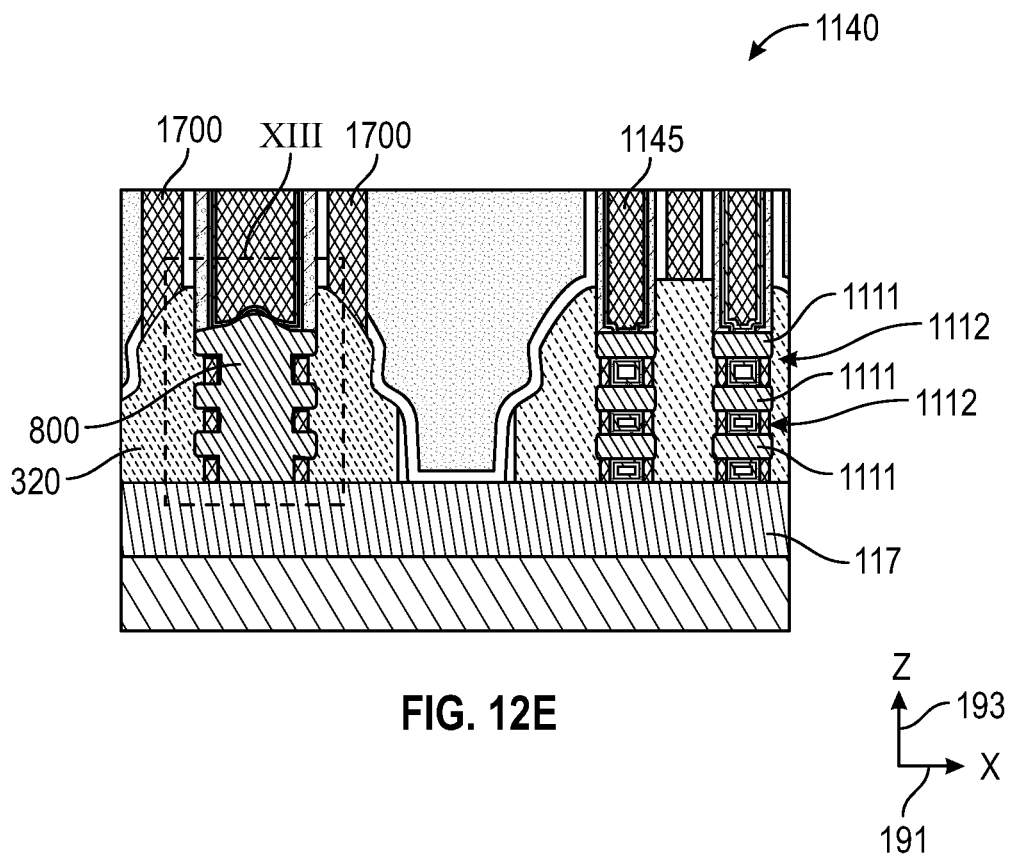
Figure 12F:
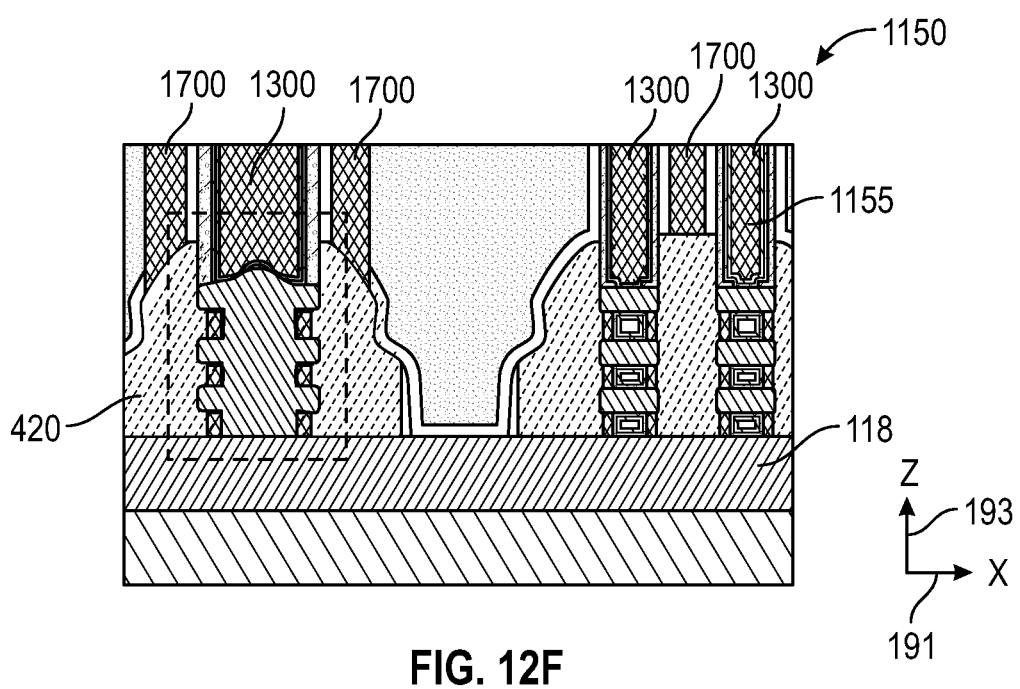

As show in FIG. 12A through 12F, some embodiments of the disclosure are directed to semiconductor devices 1100 comprising a non-I/O gate region 1110 (FIG. 12B), an I/O gate region 1120 (FIG. 12C), a source-drain non-I/O region 1130 (FIG. 12D), a pFET region 1140 (FIG. 12E) and a nFET region 1150 (FIG. 12F).

Some embodiments of the electronic device 1100 have a non-I/O gate region 1110 with a gate-all-around structure 1112. In some embodiments, the gate-all-around structure 1112 has a nanosheet 1111 core made of a first material 112 with an interlayer dielectric 1300 in contact with the first material 112. In some embodiments, a high-k dielectric 1310 contacts the interlayer dielectric 1300 on an opposite side from the first material 112. In some embodiments, a work-function metal 1320 contacts the high-k dielectric 1310 on an opposite side from the interlayer dielectric 1310.

In some embodiments, each of the nanosheets 1111 made of the first material 112 are spaced a distance from a p-type doped silicon 117 along the third direction 193. For example, FIG. 12B shows two columns of nanosheets 1111 on the right side of the Figure, each column is spaced a distance from a p-type doped silicon 117 material. In some embodiments, each of the nanosheets 1111 made of the first material 112 are spaced a distance from an n-type doped silicon 118 along the third direction 193. For example, FIG. 12B shows one column of nanosheets 1111 on the left side of the Figure; the column is spaced a distance from an n-type doped silicon 118 material. In some embodiments, each nanosheet 1111 is spaced a distance from adjacent nanosheets 1111 along the third direction 193 so that a region of gate metal 1330 is between each gate-all-around structure 1112.

The number of nanosheets 1111 and/or gate-all-around structures 1112 can vary. In some embodiments, there are in the range of 2 to 7 nanosheets 1111, or in the range of 2 to 5 nanosheets, or in the range of 3 to 4 nanosheets, or 3 nanosheets.

Some embodiments further comprise an optional gate cut pillar 502 in one or more of the non-I/O gate region 1110 (FIG. 12B) or the I/O gate region 1120 (FIG. 12C).

In some embodiments, as shown in FIG. 12C, the electronic device 1100 includes an I/O gate region 1120 with a finFET 1122. The finFET 1122 of some embodiments comprises a contact 800 made of a first material 112. In some embodiments, the finFET 1122 of the I/O gate region 1120 has a frustoconical shaped top portion.

In some embodiments, one or more of the pFET region 1140 (FIG. 12E) or the nFET region 1150 (FIG. 12F) comprises an epitaxially grown first material 112 as a pFET 320 and/or an nFET 420. In the embodiment illustrated, the pFET region 1140 (FIG. 12E) has an epitaxially grown second material 114 as a pFET 320, and the nFET region 1150 (FIG. 12F) has an epitaxially grown first material 112 as a nFET 420.

Figure 13:
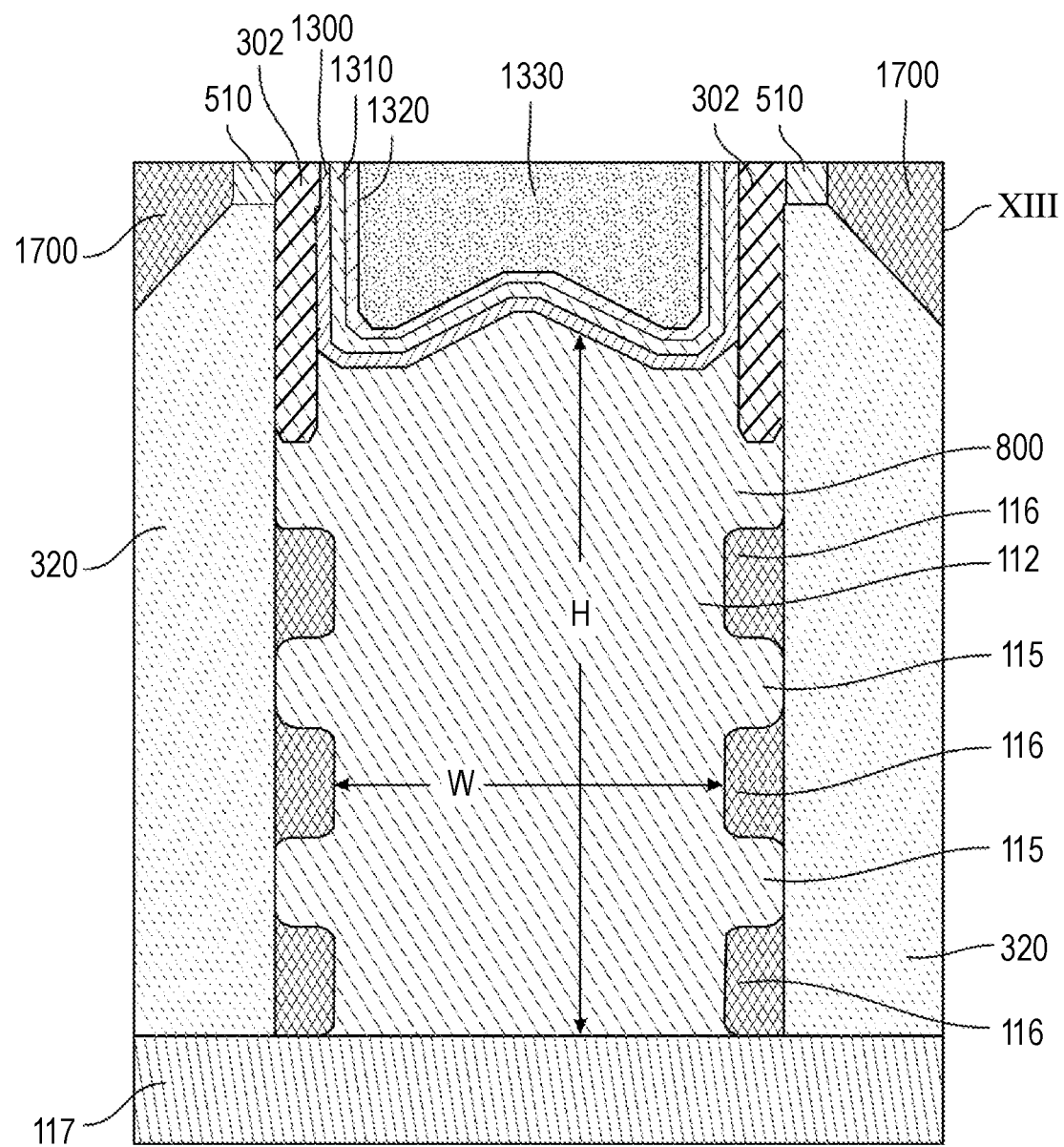
FIG. 13 illustrates an expanded view of region XII shown in FIG. 12E.
Figure 13:
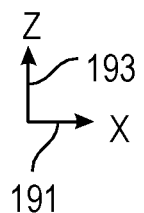

Referring to FIGS. 12E and 13, the epitaxially grown first material 112 which forms the pFET 320 has a length extending along the second direction 192. FIGS. 12E and 12 show the electronic device viewed along the second direction 192 at the plane formed by the first direction 191 and the third direction 193—the X-Z plane. The epitaxially grown first material 112 has a width W extending along the first direction 191 and a height H extending along the third direction 193. The width W of the epitaxially grown first material 112 forming contact 800 varies along the height H. In some embodiments, the epitaxially grown first material 112 has a width with a plurality of spaced protrusions The semiconductor device of claim 14, wherein the epitaxially grown first material has a length, width and height, the width having a plurality of spaced protrusions 115. Each of the protrusions 115 are separated from adjacent protrusions 115 by the inner spacer 116 (also referred to as the inner spacer dielectric). In some embodiments, each of the spaced protrusions align with nanosheets 1111 of the gate-all-around structure 1112 of the transistors shown on the right side of FIG. 12E. In some embodiments, the inner spacer has a width in the range of 1 to 10 nm, or in the range of 2 to 8 nm, or in the range of 3 to 7 nm, or in the range of 4 to 5 nm.

Some embodiments further comprise one or more of a non-I/O gate contact 1115 in electrical communication with the non-I/O gate region 1110, an I/O gate contact 1125 in electrical communication with the I/O gate region 1120, a source contact 1135 in electrical communication with a source (one of pFET 320 or nFET 420) of the source-drain non-I/O region 1130, a drain contact 1135 in electrical communication with a drain (one of the pFET 320 or nFET 420) of the source-drain non-I/O region 1130, a pFET contact 1145 in electrical communication with the pFET region 1140 and an nFET contact 1155 in electrical communication with the nFET region 1150. In some embodiments, the width of the I/O devices (shown on the left side of FIGS. 11E and 11F) are wider than the width of the transistor gates (shown on the right side of FIGS. 11E and 11F). The wider gates for the I/O devices allow for higher voltages and/or greater current to be applied. In some embodiments, the I/O gates are greater than 1.5×, 2×, 4×, 7× or 10× the width of the non-I/O gates.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A semiconductor device comprising a non-I/O gate region comprising a gate-all-around structure, an I/O gate region comprising a finFET, a source-drain non-I/O region, a pFET region and an nFET region, one or more of the pFET region or the nFET region comprises an epitaxially grown first material having a length, width and height, the width having a plurality of spaced protrusions.

2. The semiconductor device of claim 1, wherein the spaced protrusions align with nanosheets of the gate-all-around structure.

3. The semiconductor device of claim 2, wherein there are in the range of 2 to 7 nanosheets.

4. The semiconductor device of claim 3, further comprising a gate cut pillar in one or more of the non-I/O gate regions or the I/O gate region.

5. The semiconductor device of claim 1, further comprising a non-I/O gate contact in electrical communication with the non-I/O gate region, an I/O gate contact in electrical communication with the I/O gate region, a source contact in electrical communication with a source of the source-drain non-I/O region, a drain contact in electrical communication with a drain of the source-drain non-I/O region, a pFET contact in electrical communication with the pFET region and an nFET contact in electrical communication with the nFET region.

6. A semiconductor device comprising:
a non-I/O gate region having a gate-all-around structure and a non-I/O gate contact, the gate-all-around structure comprising a plurality of spaced nanosheets;
an I/O gate region comprising a finFET and an I/O contact;
a source-drain non-I/O region comprising a source contact and a drain contact;
a pFET region comprising an epitaxially grown first material and a pFET contact, the epitaxially grown first material has a length, width and height, the width having a plurality of spaced protrusions, the protrusions aligned with the spaced nanosheets; and
an nFET region comprising an epitaxially grown second material and an nFET contact.

\* \* \* \* \*